United States Patent
An et al.

(10) Patent No.: US 12,205,852 B2
(45) Date of Patent: Jan. 21, 2025

(54) TEST METHOD OF STORAGE DEVICE IMPLEMENTED IN MULTI-CHIP PACKAGE (MCP) AND METHOD OF MANUFACTURING AN MCP INCLUDING THE TEST METHOD

(71) Applicant: Samsung Electronics Co., Ltd., Suwon-si (KR)

(72) Inventors: Sangmin An, Asan-si (KR); Haengjin Lee, Anyang-si (KR); Changseok Han, Goyang-si (KR); Taehwan Oh, Asan-si (KR); Minchul Jun, Gwangmyeong-si (KR); Byeongcheol Choi, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 552 days.

(21) Appl. No.: 17/460,207

(22) Filed: Aug. 28, 2021

(65) Prior Publication Data
US 2022/0102224 A1   Mar. 31, 2022

(30) Foreign Application Priority Data

Sep. 29, 2020   (KR) ................. 10-2020-0127540
Nov. 2, 2020   (KR) ................. 10-2020-0144725
Feb. 22, 2021   (KR) ................. 10-2021-0023694

(51) Int. Cl.
*H01L 21/66*   (2006.01)
*G01R 31/28*   (2006.01)
(Continued)

(52) U.S. Cl.
CPC .......... *H01L 22/14* (2013.01); *G01R 31/2896* (2013.01); *G01R 31/318513* (2013.01);
(Continued)

(58) Field of Classification Search
None
See application file for complete search history.

(56) References Cited

U.S. PATENT DOCUMENTS 9,159,454 B2   10/2015  Lee
10,338,134 B2   7/2019  Jun et al.
(Continued)

FOREIGN PATENT DOCUMENTS

KR   1020170056349 A   5/2017

*Primary Examiner* — Dale E Page
*Assistant Examiner* — Derek L Nielsen
(74) *Attorney, Agent, or Firm* — Muir Patent Law, PLLC

(57) ABSTRACT

A method of manufacturing a multi-chip package (MCP) is provided. The MCP includes a first type semiconductor chip, a second type semiconductor chip, and a memory controller configured to control the second type semiconductor chip. The method includes mounting the first type semiconductor chip and the memory controller on a substrate, mounting the second type semiconductor chip on the first type semiconductor chip, forming a mold layer to cover the first and second type semiconductor chips and the memory controller, performing a function test on the first type semiconductor chip and simultaneously determining whether a crack defect occurred in the second type semiconductor chip. The crack defect of the second type semiconductor chip is determined when a current measured in a low power mode test of the second type semiconductor chip is greater than or equal to a test reference value.

15 Claims, 15 Drawing Sheets

(51) Int. Cl.
    *G01R 31/3185* (2006.01)
    *G11C 14/00* (2006.01)
    *H01L 23/31* (2006.01)
    *H01L 25/065* (2023.01)

(52) U.S. Cl.
    CPC .......... *G11C 14/0018* (2013.01); *H01L 23/31* (2013.01); *H01L 25/0657* (2013.01)

(56) References Cited

U.S. PATENT DOCUMENTS

| | | |
|---|---|---|
| 10,410,736 B2 | 9/2019 | Chen et al. |
| 10,510,432 B1 | 12/2019 | Shen |
| 10,535,398 B2 | 1/2020 | Shaeffer et al. |
| 2015/0235715 A1 | 8/2015 | Cho |
| 2016/0111169 A1 | 4/2016 | Kim et al. |
| 2017/0139004 A1* | 5/2017 | Jun ...................... H05K 1/0268 |
| 2017/0261548 A1* | 9/2017 | Yun .................... G01R 31/2893 |
| 2019/0242941 A1 | 8/2019 | Wu et al. |
| 2020/0150149 A1 | 5/2020 | Whetsel |

* cited by examiner

TEST METHOD OF STORAGE DEVICE IMPLEMENTED IN MULTI-CHIP PACKAGE (MCP) AND METHOD OF MANUFACTURING AN MCP INCLUDING THE TEST METHOD

CROSS-REFERENCE TO RELATED APPLICATIONS

This application is based on and claims priority under 35 U.S.C. § 119 to Korean Patent Application Nos. 10-2020-0127540, 10-2020-0144725, and 10-2021-0023694, filed on Sep. 29, 2020, Nov. 2, 2020, and Feb. 22, 2021, respectively, in the Korean Intellectual Property Office, the disclosures of which are incorporated by reference herein in their entireties.

BACKGROUND

The inventive concept relates to a semiconductor device, and more particularly, to a test method of determining whether a crack defect occurs in a second type semiconductor chip during testing of a first type semiconductor chip in a multi-chip package (MCP) in which a storage device including a plurality of semiconductor chips is implemented.

Electronic devices include a plurality of semiconductor integrated circuits (or semiconductor chips), and their hardware configuration has become more complex. In accordance with the demand for miniaturization and weight reduction of the electronic devices, a multi-chip package (MCP) in which a plurality of semiconductor chips are mounted in one package has been developed in order to reduce the number of mounted components. A system using semiconductor chips uses a dynamic random access memory (DRAM) as an operating memory or main memory of the system and also uses a storage device as a storage medium in order to store data or instructions used by a host in the system and/or to perform a computational operation. The storage device may include a plurality of nonvolatile memories (NVMs). As the capacity of the storage device increases, for stable and fast real-time processing of a large amount of data, the NVM chips, a memory controller chip that controls the NVM chips, and a DRAM chip that temporarily stores (buffers) data to be written to the NVMs or data read from the NVMs may be implemented as an MCP.

In such an MCP, the memory controller chip and the NVM chips may be internally connected to each other through a bonding wire, while the DRAM chips may not be connected to the memory controller chip and the NVM chips. An MCP including two types of memory chips such as a DRAM chip and an NVM chip may perform a test on a first type memory chip and then a test on a second type memory chip when performing a function test. In the second type semiconductor chip, crack defects may occur in a process of testing the first type semiconductor chip. The crack defect in the second type memory chip may be identified only after the test of the first type semiconductor chip is completed. Accordingly, the productivity of the MCP test may decrease.

When it is possible to identify whether a crack defect has occurred in the second type semiconductor chip while testing the first type semiconductor chip of the MCP, if such a facility is possible, the test efficiency may be improved, which will be beneficial to improving the test productivity.

SUMMARY

The present disclosure provides a test method of determining whether a crack defect occurs in a second type semiconductor chip during testing of a first type semiconductor chip in a multi-chip package (MCP) in which a storage device including a plurality of semiconductor chips is implemented.

According to an aspect of the inventive concept, there is provided a method of manufacturing a multi-chip package (MCP) including a first type semiconductor chip and a second type semiconductor chip. The method includes mounting the first type semiconductor chip on a substrate; mounting the second type semiconductor chip on the first type semiconductor chip; forming a mold layer to cover the first and second type semiconductor chips; placing the MCP on test equipment, wherein the test equipment includes a test host configured to test the MCP; performing a function test on the first type semiconductor chip using first channel terminals of the test equipment, wherein the test host applies signals related to the function test of the first type semiconductor chip to the first channel terminals; performing a low power mode test on the second type semiconductor chip using second channel terminals of the test equipment, wherein the test host applies signals related to the low power mode test of the second type semiconductor chip to the second channel terminals; and analyzing a current measured in the second channel terminals to determine if a crack defect exists in the second type semiconductor chip. The function test of the first type semiconductor chip and the low power mode test of the second type semiconductor chip are performed in parallel.

According to another aspect of the inventive concept, there is provided a method of manufacturing a multi-chip package (MCP) implementing a storage device including a first type memory device, a second type memory device, and a memory controller configured to control the second type memory device. The method includes mounting the first type memory device and the memory controller on a substrate; mounting the second type memory device on the first type memory device; forming a mold layer to cover the first and second type memory devices and the memory controller; placing the MCP on test equipment, the test equipment including a test host configured to test the MCP; performing a first function test on the first type memory device using first channel terminals of the test equipment, and simultaneously performing a low power mode test on the second type memory device using second channel terminals of the test equipment, and detecting, by the test host; analyzing a current measured in the second channel terminals to determine if a crack defect exists in the second type memory device; and performing a second function test on the memory controller and the second type memory device using the second channel terminals of the test equipment, and simultaneously performing a leakage current test on the first type memory device using the first channel terminals of the test equipment.

According to another aspect of the inventive concept, there is provided a test board for testing a multi-chip package (MCP) implementing a storage device including a first type memory device, a second type memory device, and a memory controller configured to control the second type memory device including a first surface facing the MCP, the first surface including upper terminals electrically connected to corresponding package terminals of the MCP, and the upper terminals including first upper terminals connected to first package terminals related to the first type memory device and second upper terminals connected to second package terminals related to the memory controller and the second type memory device; and a second surface facing test equipment configured to test the MCP, the test equipment including a test host configured to test the MCP, and the second surface including first lower terminals connected to first channel terminals of the test equipment and second lower terminals connected to second channel terminals of the test equipment. The test host is configured to perform a first function test on the first type memory device using the first channel terminals of the test equipment, and simultaneously perform a low power mode test on the second type memory device using the second channel terminals of the test equipment to determine a pass or failure of the low power mode test.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
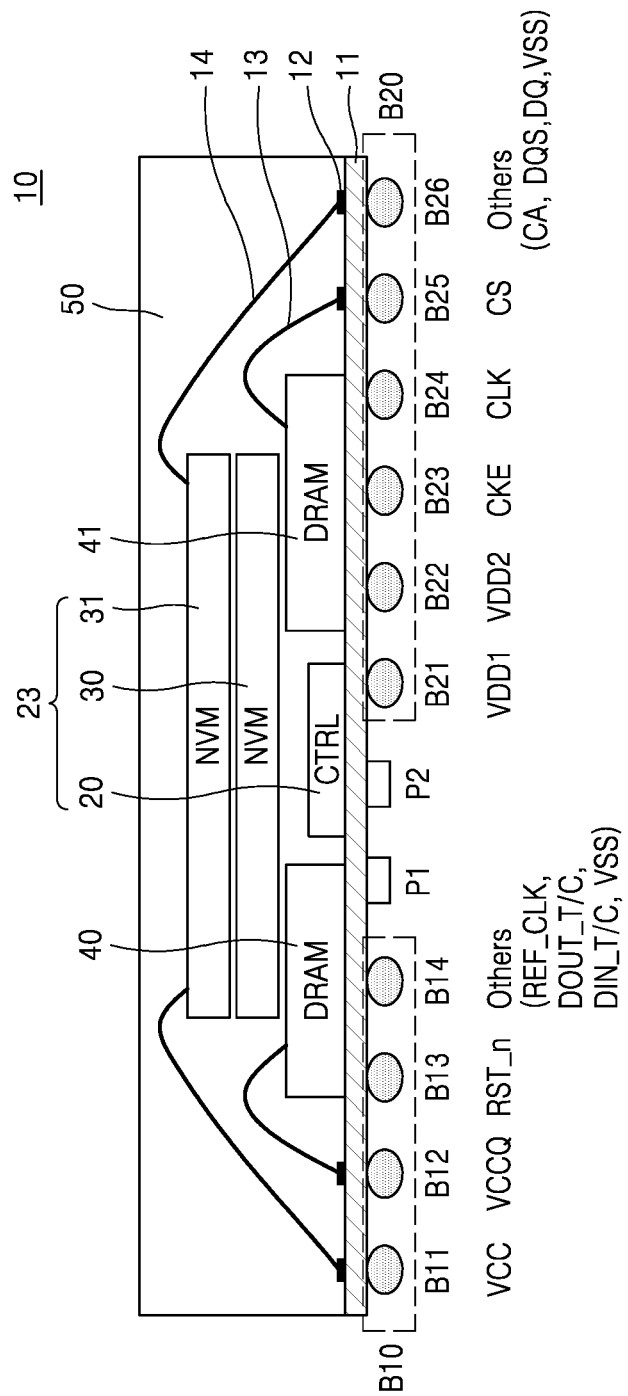
FIG. 1 is a diagram illustrating an example in which a storage device is implemented in a multi-chip package (MCP) according to an embodiment of the inventive concept.

FIG. 1 is a diagram illustrating an example in which a storage device is implemented in a multi-chip package (MCP) 10 according to an embodiment of the inventive concept. Hereinafter, the terms of the MCP 10 and a storage device 10 may be used interchangeably.

Referring to FIG. 1, the MCP 10 includes a package substrate 11, a memory controller chip 20, nonvolatile memory (NVM) chips 30 and 31, DRAM chips 40 and 41, a first conductive wire 13, a second conductive wire 14, external connection terminals B11 to B14, P1 and P2, and B21 to B26, and a mold layer 50. Herein, the external connection terminals B11 to B14, P1 and P2, and B21 to B26 may be referred to as package terminals or package balls. In FIG. 1, the two NVM chips 30 and 31 and the two DRAM chips 40 and 41 are shown in the MCP 10, but the inventive concept is not limited thereto, and other configurations are possible. For example, $2^n$ NVM chips (n is natural number equal to or greater than 0) and one or more DRAM chips may be included in the MCP 10. Each of the DRAM chips 40 and 41 may be a first type semiconductor chip, each of the NVM chips 30 and 31 may be a second type semiconductor chip, and the memory controller chip 20 may be a third type semiconductor chip.

Figure 2:
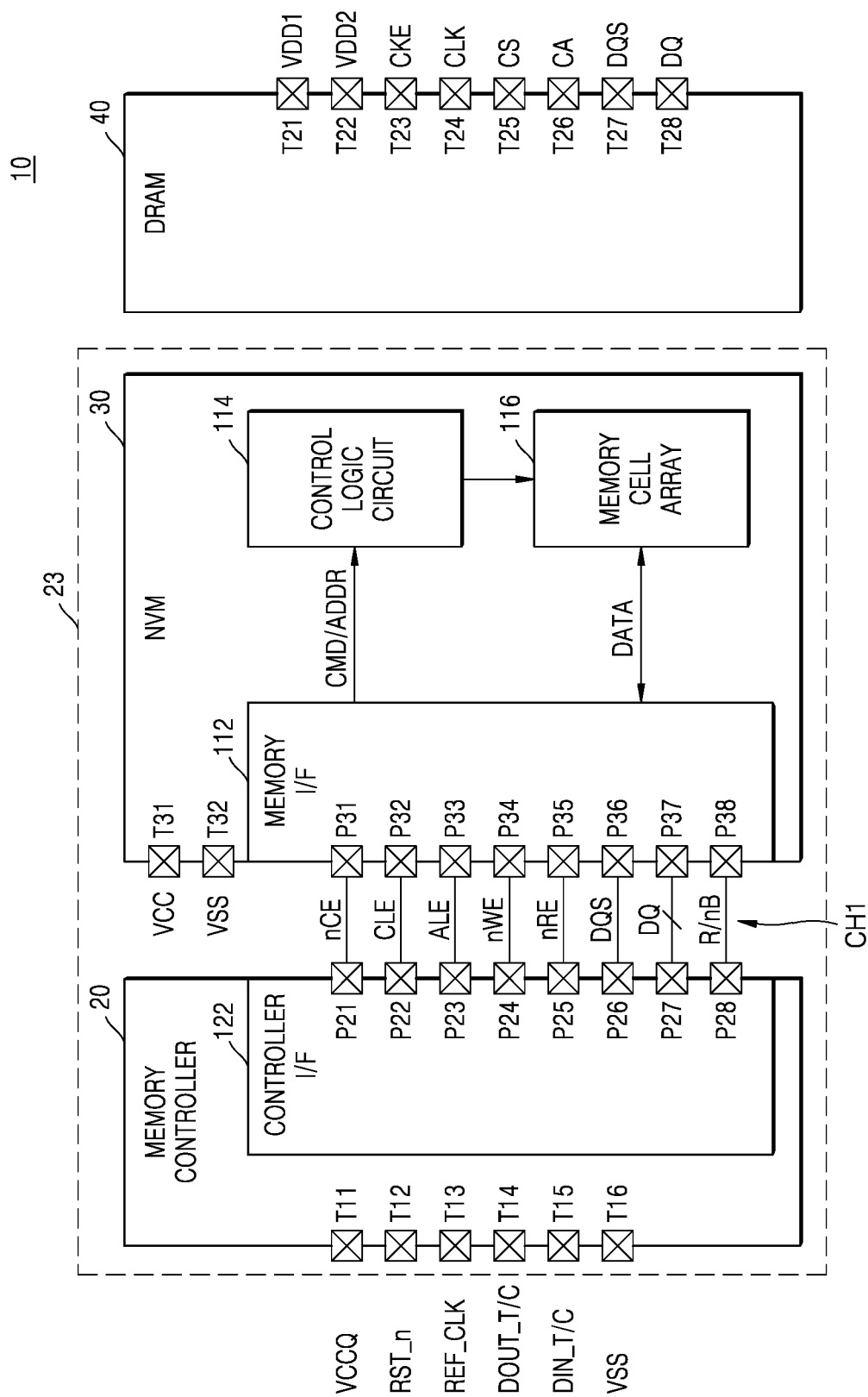
FIG. 2 is a diagram illustrating a memory interface of the storage device of FIG. 1 according to an embodiment of the inventive concept.

In the MCP 10, the memory controller chip 20 and the NVM chips 30 and 31 are connected to each other in a package, and a storage function may be performed by a connection relationship therebetween (FIG. 2). Accordingly, the memory controller chip 20 and the NVM chips 30 and 31 may be referred to as an eStorage 23 that serves as an embedded storage function. In the following embodiments, for convenience of description, the terms of the memory controller chip 20 and the NVM chips 30 and 31 and the eStorage 23 may be used interchangeably.

The package substrate 11 may include a plurality of conductive layers separated by an insulating layer and through electrodes therein. The conductive layers and the through electrodes of the package substrate 11 may be connected to a substrate pad 12 and the external connection terminals B11 to B14, P1 and P2, and B21 to B26. For example, the external connection terminals B11 to B14, P1 and P2, and B21 to B26 may include package balls (e.g., solder balls) B11 to B14 and B21 to B26 and package pins P1 and P2. The package pins P1 and P2 refer to direct pins having a function of directly testing the MCP 10. For example, the package pins P1 and P2 may be used to directly test the NVM chips 30 and 31. In an example embodiment illustrated in FIG. 1, although only two package pins P1 and P2 are shown, but the invention is not limited to thereto, for example, the number of package pins is 3 or more.

The DRAM chips 40 and 41 may be spaced apart from each other and attached to (or mounted on) an upper surface of the package substrate 11. An adhesive layer (not shown) may be provided between a top surface of the package substrate 11 and the DRAM chips 40 and 41. The DRAM chips 40 and 41 may have the first conductive wire 13. The first conductive wire 13 electrically connects terminals of the DRAM chips 40 and 41 to the substrate pad 12 of the package substrate 11.

The memory controller chip 20 may be attached to (or mounted on) the upper surface of the package substrate 11 and disposed between the DRAM chips 40 and 41 spaced apart from each other. An adhesive layer (not shown) may be provided between the top surface of the package substrate 11 and the memory controller chip 20. The memory controller chip 20 may be physically and electrically connected to the NVM chips 30 and 31.

The NVM chips 30 and 31 may have a stacked structure, and the stacked NVM chips 30 and 31 may be attached to (or mounted on) upper surfaces of the DRAM chips 40 and 41. An adhesive layer (not shown) may be provided between the NVM chips 30 and 31. The NVM chips 30 and 31 may have the second conductive wire 14. The second conductive wire 14 electrically connects terminals of the NVM chips 30 and 31 to the substrate pad 12 of the package substrate 11. The substrate pad 12 exists as a plurality of substrate pads, but will be described as a single pad. Although not shown in FIG. 1, the second conductive wire 14 may electrically connect terminals of the memory controller chip 20 to the substrate pad 12 of the package substrate 11.

The mold layer 50 may be provided to encapsulate the memory controller chip 20, the nonvolatile memory (NVM) chips 30 and 31, and the DRAM chips 40 and 41. The mold layer 50 may have side surfaces and a top surface. The mold layer 50 may be formed of or include an insulating polymer material, for example, epoxy molding compound (EMC).

The package balls B11 to B14 and B21 to B26 may be divided into a first group B10 and a second group B20. The first group B10 to which the package balls B11 to B14 belong may be connected to the memory controller chip 20 and the NVM chips 30 and 31 through the package substrate 11, the substrate pad 12 and the second conductive wire 14. The package balls B11 to B14 of the first group B10 may correspond to signals and power sources related to the eStorage 23 including the memory controller chip 20 and the NVM chips 30 and 31. Signals and power sources related to the eStorage 23 may include a reference clock signal REF_CLK, a hardware reset signal RST_n, a differential input signal DIN_T/C, a differential output signal DOUT_T/C, a main power voltage VCC, a power voltage VCCQ, and a ground voltage VSS. The differential input signal DIN_T/C exists as a pair of DIN_T and DIN_C signals, but will be described as a single signal. Also, the differential output signal DOUT_T/C exists as a pair of DOUT_T and DOUT_C signals, but will be described as a single signal.

For example, the main power voltage VCC may correspond to the package ball B11, the power voltage VCCQ may correspond to the package ball B12, and the hardware reset signal RST_n may correspond to the package ball B13. For the brevity of the drawing, the ground voltage VSS and the remaining signals (e.g., the reference clock signal REF_CLK, the differential output signal DOUT_T/C, and the differential input signal DIN_T/C) related to the eStorage 23 may correspond to the package ball B14. In practice, the package ball B14 will be multiple package balls.

In example embodiments, the main power voltage VCC may be supplied to the NVM chips 30 and 31 through the package ball B11, and the power voltage VCCQ may be supplied to the memory controller chip 20 through the package ball B12.

The second group B20 to which the package balls B21 to B26 belong may be electrically connected to the substrate pad 12 connected to the DRAM chips 40 and 41. The package balls B21 to B26 of the second group B20 may correspond to signals and power sources related to the DRAM chips 40 and 41. Signals and power sources related to the DRAM chips 40 and 41 may include a clock enable signal CKE, a clock signal CLK, a chip select signal CS, a command/address signal CA, a data strobe signal DQS, a data signal DQ, a first power voltage VDD1, a second power voltage VDD2, and a ground voltage VSS. Each of the command/address signal CA and the data signal DQ are provided in plural, but will be described as a single signal.

For example, the first power voltage VDD1 may correspond to the package ball B21, the second power supply voltage VDD2 may correspond to the package ball B22, the clock enable signal CKE may correspond to the package ball B23, the clock CLK may correspond to the package ball B24, and the chip select signal CS may correspond to the package ball B25. For the brevity of the drawing, the ground voltage VSS and the remaining signals (e.g., the command/address signal CA, the data strobe signal DQS, and the data input/output signal DQ) related to the DRAM chips 40 and 41 may corresponded to the package ball B26. In practice, the package ball B26 will be multiple package balls.

Inside the MCP 10, the eStorage 23 including the memory controller chip 20 and the NVM chips 30 and 31 and the DRAM chips 40 and 41 are not connected to each other. The structure of the MCP 10 may be described in detail with reference to FIG. 2.

FIG. 2 is a diagram illustrating a memory interface of a storage device of FIG. 1 according to example embodiments. In FIG. 2, a first NVM chip 30 among the NVM chips 30 and 31 and a first DRAM chip 40 among the DRAM chips 40 and 41 of FIG. 1 are representatively described. The description of the first NVM chip 30 and the first DRAM chip 40 will be equally applied to the remaining NVM chip 31 and DRAM chip 41. In the following embodiments, for convenience of description, the terms of the memory controller chip 20 and the memory controller 20, the terms of the first NVM chip 30 and the first NVM 30, and the terms of the first DRAM chip 40 and the first DRAM 40 may be used interchangeably.

Referring to FIGS. 1 and 2, the memory controller 20 is connected to the first NVM 30. The first NVM 30 may include a first terminal T31, a second terminal T32, first to eighth pins P31 to P38, a memory interface circuit 112, a control logic circuit 114, and a memory cell array 116. The first NVM 30 may receive a ground voltage VSS applied to the package ball B14 through the second terminal T32.

The memory interface circuit 112 may receive a chip enable signal nCE from the memory controller 20 through a first pin P31. The memory interface circuit 112 may transmit and receive signals to and from the memory controller 20 through the second to eighth pins P32 to P38 according to the chip enable signal nCE. For example, when the chip enable signal nCE is in an enable state (for example, a low level), the memory interface circuit 112 may transmit and receive signals to and from the memory controller 20 through the second to eighth pins P32 to P38.

The memory interface circuit 112 may receive a command latch enable signal CLE, an address latch enable signal ALE, and a write enable signal nWE from the memory controller 20 through the second to fourth pins P32 to P34. The memory interface circuit 112 may receive or transmit the data signal DQ from or to the memory controller 20 through the seventh pin P37. The command CMD, the address ADDR, and the data DATA may be transmitted through the data signal DQ. For example, the data signal DQ may be transmitted through a plurality of data signal lines. In this case, the seventh pin P37 may include a plurality of pins respectively corresponding to the plurality of data signals.

The memory interface circuit 112 may obtain the command CMD from the data signal DQ received in an enable period (e.g., a high level state) of the command latch enable signal CLE based on toggle timings of a write enable signal nWE. The memory interface circuit 112 may obtain the address ADDR from the data signal DQ received in an enable period (e.g., a high level state) of the address latch enable signal ALE based on the toggle timings of the write enable signal nWE.

In an embodiment, the write enable signal nWE may maintain a static state (e.g., a high level or a low level) and then toggle between the high level and the low level. For example, the write enable signal nWE may toggle in a period in which the command CMD or the address ADDR is transmitted. Accordingly, the memory interface circuit 112 may obtain the command CMD or the address ADDR based on the toggle timings of the write enable signal nWE.

The memory interface circuit 112 may receive a read enable signal nRE from the memory controller 20 through the fifth pin P35. The memory interface circuit 112 may receive the data strobe signal DQS from the memory controller 20 through the sixth pin P36 or transmit the data strobe signal DQS to the memory controller 20.

In a data DATA output operation of the first NVM 30, the memory interface circuit 112 may receive the read enable signal nRE toggling through the fifth pin P35 before outputting the data DATA. The memory interface circuit 112 may generate the data strobe signal DQS that toggles based on toggling of the read enable signal nRE. For example, the memory interface circuit 112 may generate the data strobe signal DQS that starts toggling after a previously determined delay (e.g., tDQSRE) with respect to a toggling start time of the read enable signal nRE. The memory interface circuit 112 may transmit the data signal DQ including the data DATA based on a toggle timing of the data strobe signal DQS. Accordingly, the data DATA may be aligned with the toggle timing of the data strobe signal DQS and transmitted to the memory controller 20.

In a data DATA input operation of the first NVM 30, when the data signal DQ including data DATA is received from the memory controller 20, the memory interface circuit 112 may receive the data strobe signal DQS that toggles together with the data DATA from the memory controller 20. The memory interface circuit 112 may obtain the data DATA from the data signal DQ based on the toggle timing of the data strobe signal DQS. For example, the memory interface circuit 112 may obtain the data DATA by sampling the data signal DQ at a rising edge and/or a falling edge of the data strobe signal DQS.

The memory interface circuit 112 may transmit a ready/busy output signal R/nB to the memory controller 20 through the eighth pin P38. The memory interface circuit 112 may transmit state information of the first NVM 30 to the memory controller 20 through the ready/busy output signal R/nB. When the first NVM 30 is in a busy state (that is, when internal operations of the first NVM 30 are being performed), the memory interface circuit 112 may transmit the ready/busy output signal R/nB indicating the busy state to the memory controller 20. When the first NVM 30 is in a ready state (that is, when internal operations of the first NVM 30 are not performed or completed), the memory interface circuit 112 may transmit the ready/busy output signal R/nB indicating the ready state to the memory controller 20. For example, while the first NVM 30 reads the data DATA from the memory cell array 116 in response to a page read command, the memory interface circuit 112 may transmit the ready/busy output signal R/nB indicating the busy state (e.g., a low level) to the memory controller 20. For example, while the first NVM 30 is programming the data DATA into the memory cell array 116 in response to a program command, the memory interface circuit 112 may transmit the ready/busy output signal R/nB indicating the busy state to the memory controller 20.

In example embodiments, each of the first to eighth pins P31 to P38 may be connected to a corresponding package pin (e.g., P1, P2, etc.) of a plurality of package pins.

The control logic circuit 114 may generally control various operations of the first NVM 30. The control logic circuit 114 may receive the command/address CMD/ADDR obtained from the memory interface circuit 112. The control logic circuit 114 may generate control signals for controlling other components of the first NVM 30 according to the received command/address CMD/ADDR. For example, the control logic circuit 114 may generate various control signals for programming the data DATA into the memory cell array 116 or reading the data DATA from the memory cell array 116.

The memory cell array 116 may store the data DATA obtained from the memory interface circuit 112 under the control of the control logic circuit 114. The memory cell array 116 may output the stored data DATA to the memory interface circuit 112 under the control of the control logic circuit 114.

The memory cell array 116 may include a plurality of memory cells. For example, the plurality of memory cells may be flash memory cells. However, the inventive concept is not limited thereto, and the memory cells may be Resistive Random Access Memory (RRAM) cells, Ferroelectric RAM (FRAM) cells, Phase change RAM (PRAM) cells, Thyristor RAM (TRAM) cells, and Magnetic RAM (MRAM) cells. Hereinafter, embodiments of the inventive concept will be described in which the memory cells are NAND flash memory cells.

The memory controller 20 may include first to eighth pins P21 to P28, a controller interface circuit 122, and first to sixth terminals T11 to T16. The first to eighth pins P21 to P28 may correspond to the first to eighth pins P31 to P38 of the first NVM 30, and the first to sixth terminals T11 to T16 may be connected to package balls of the first group B10 of the MCP 10.

The controller interface circuit 122 may transmit the chip enable signal nCE to the first NVM 30 through the first pin P21. The controller interface circuit 122 may transmit and receive signals to and from the first NVM 30 selected by the chip enable signal nCE through the second to eighth pins P22 to P28.

The controller interface circuit 122 may transmit the command latch enable signal CLE, the address latch enable signal ALE, and the write enable signal nWE to the first NVM 30 through the second to fourth pins P22 to P24. The controller interface circuit 122 may transmit or receive the data signal DQ to or from the first NVM 30 through the seventh pin P27.

The controller interface circuit 122 may transmit the data signal DQ including the command CMD or the address ADDR to the first NVM 30 together with the write enable signal nWE that toggles. The controller interface circuit 122 may transmit the data signal DQ including the command CMD to the first NVM 30 as the command latch enable signal CLE having an enable state is transmitted, and may transmit the data signal DQ including the address ADDR to the first NVM 30 as the address latch enable signal ALE having an enable state is transmitted.

The controller interface circuit 122 may transmit the read enable signal nRE to the first NVM 30 through the fifth pin P25. The controller interface circuit 122 may receive or transmit the data strobe signal DQS from or to the first NVM 30 through the sixth pin P26.

In the data DATA output operation of the first NVM 30, the controller interface circuit 122 may generate the read enable signal nRE that toggles, and transmit the read enable signal nRE to the first NVM 30. For example, the controller interface circuit 122 may generate the read enable signal nRE that changes from a static state (e.g., a high level or a low level) to a toggle state before the data DATA is output. Accordingly, the data strobe signal DQS that toggles based on the read enable signal nRE may be generated in the first NVM 30. The controller interface circuit 122 may receive the data signal DQ including the data DATA together with the data strobe signal DQS that toggles from the first NVM 30. The controller interface circuit 122 may obtain the data DATA from the data signal DQ based on the toggle timing of the data strobe signal DQS.

In the data DATA input operation of the first NVM 30, the controller interface circuit 122 may generate the data strobe signal DQS that toggles. For example, the controller interface circuit 122 may generate the data strobe signal DQS that changes from a static state (e.g., a high level or a low level) to a toggle state before transmitting the data DATA. The controller interface circuit 122 may transmit the data signal DQ including the data DATA to the first NVM 30 based on toggle timings of the data strobe signal DQS.

The controller interface circuit 122 may receive the ready/busy output signal R/nB from the first NVM 30 through the eighth pin P28. The controller interface circuit 122 may determine state information of the first NVM 30 based on the ready/busy output signal R/nB.

The first to sixth terminals T11 to T16 of the memory controller 20 may be connected to the package balls of the first group B10 through the second conductive wire 14, the substrate pad 12 and the package substrate 11.

The first NVM 30 may receive the main power voltage VCC applied to the package ball B11 through the first terminal T31 of the first NVM 30. The memory controller 20 may receive the power voltage VCCQ applied to the package ball B12 through the first terminal T11 of the memory controller 20, and receive the ground voltage VSS applied to the package ball B14 through the sixth terminal T16. The memory controller 20 may receive the hardware reset signal RST_n applied to the package ball B13 through the second terminal T12. Further, the memory controller 20 may receive the remaining signals related to the eStorage 23 applied to the package ball B14, receive the reference clock signal REF_CLK through the third terminal T13, receive the differential output signal DOUT_T/C through the fourth terminal T14, and receive the differential input signal DIN_T/C through the fifth terminal T15.

In the MCP 10, the eStorage 23 and the first DRAM 40 are not connected to each other. The first DRAM 40 may be configured as a Low Power Double Data Rate (LPDDR) DRAM, and may include first to eighth terminals T21 to T28. The first to eighth terminals T21 to T28 of the first DRAM 40 may be connected to package balls of the second group B20 through the first conductive wire 13, the substrate pad 12 and the package substrate 11.

The first DRAM 40 may receive the first power voltage VDD1 applied to the package ball B21 through the first terminal T21, and may receive the second power voltage VDD2 applied to the package ball B22 through the second terminal T22. The first DRAM 40 may receive the clock enable signal CKE applied to the package ball B23 through the third terminal T23, receive the clock signal CLK applied to the package ball B24 through the fourth terminal T24, and receive the chip selection signal CS applied to the B25 package ball through the fifth terminal T25. In addition, the first DRAM 40 may receive the remaining signals related to the first DRAM 40 applied to the package ball B26, receive the command/address signal CA through the sixth terminal T26, receive the data strobe signal DQS through the seventh terminal T27, and receive the data input/output signal DQ through the eighth terminal T28.

Although not shown in FIG. 2, the first DRAM chip 40 may include a ninth terminal T29. The first DRAM chip 40 may receive a ground voltage VSS applied to the package ball B26 through the ninth terminal T29.

Figure 3A:
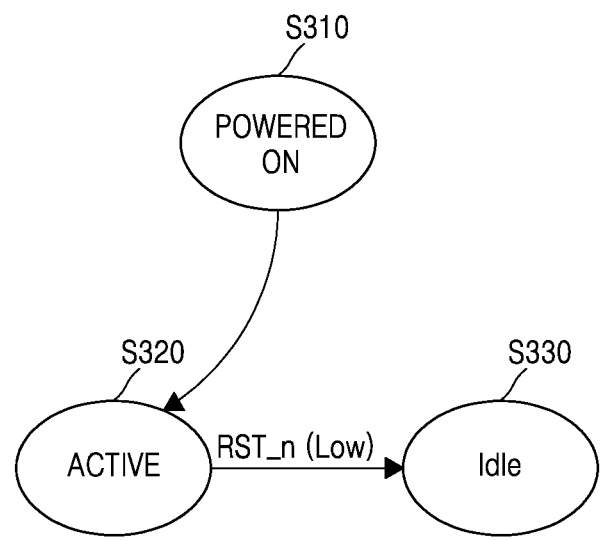
FIGS. 3A and 3B are diagrams illustrating an operating state of the storage device of FIG. 1 according to an embodiment of the inventive concept.
Figure 3B:
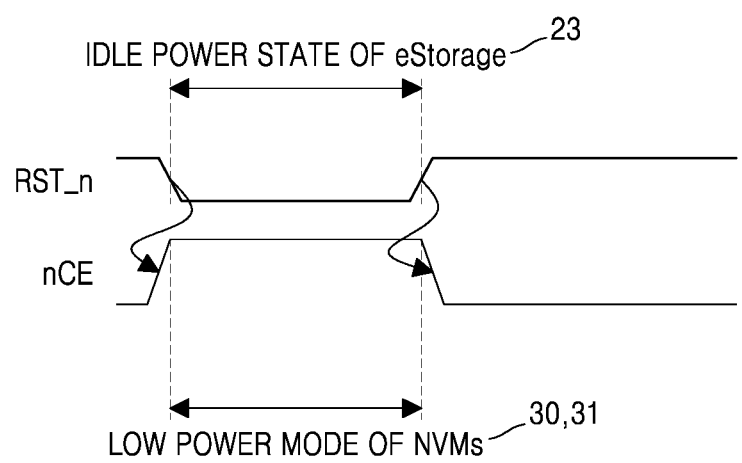

FIGS. 3A and 3B are diagrams illustrating an operating state of the storage device 10 of FIG. 1 according to example embodiments. FIG. 3A shows a part of power mode state machine of the eStorage 23 in the storage device 10, and FIG. 3B is a signal diagram when the eStorage 23 is in an idle power state.

Referring to FIGS. 1 and 3A, when power is supplied to the storage device 10, the storage device 10 may be powered on. When the main power voltage VCC and the power voltage VCCQ are supplied to the storage device 10, the eStorage 23 enters a power-on state S310. For example, the main power voltage VCC may have a value of about 2.4 to 3.6V, and the power voltage VCCQ may have a value of about 1.14 to 1.26V lower than the main power voltage VCC.

The eStorage 23 may transition from the power-on state S310 to an active power state S320 when is ready to start a power-on initialization. When the hardware reset signal RST_n is applied at a low level in the active power state S320, the eStorage 23 may transition to an idle power state S330.

Referring to FIGS. 2 and 3B, when the hardware reset signal RST_n is applied to the storage device 10 at a low level, the eStorage 23 enters the idle power state S330, and the memory controller 20 may generate the chip enable signal nCE of a high level and transmit the chip enable signal nCE to the first NVM 30. In this regard, the memory controller 20 may also transmit the chip enable signal nCE of a high level to the second NVM 31. The first and second NVMs 30 and 31 receiving the chip enable signal nCE of a high level may be staggered power-up under a low power condition. The low power condition may be set to limit a current load of the first and second NVMs 30 and 31. That is, when the hardware reset signal RST_n is applied to the storage device 10 at a low level, because the first and second NVMs 30 and 31 have limited current load, the storage device 10 may enter the lower power mode in which a very small current flows or current hardly flows.

When the first and second NVMs 30 and 31 are in the low power mode in the idle power state S330 of the eStorage 23, if a leakage current is detected during a test on the storage device 10, it may be determined that crack defects exist in the first and second NVMs 30 and 31 based on the leakage current.

Figure 4:
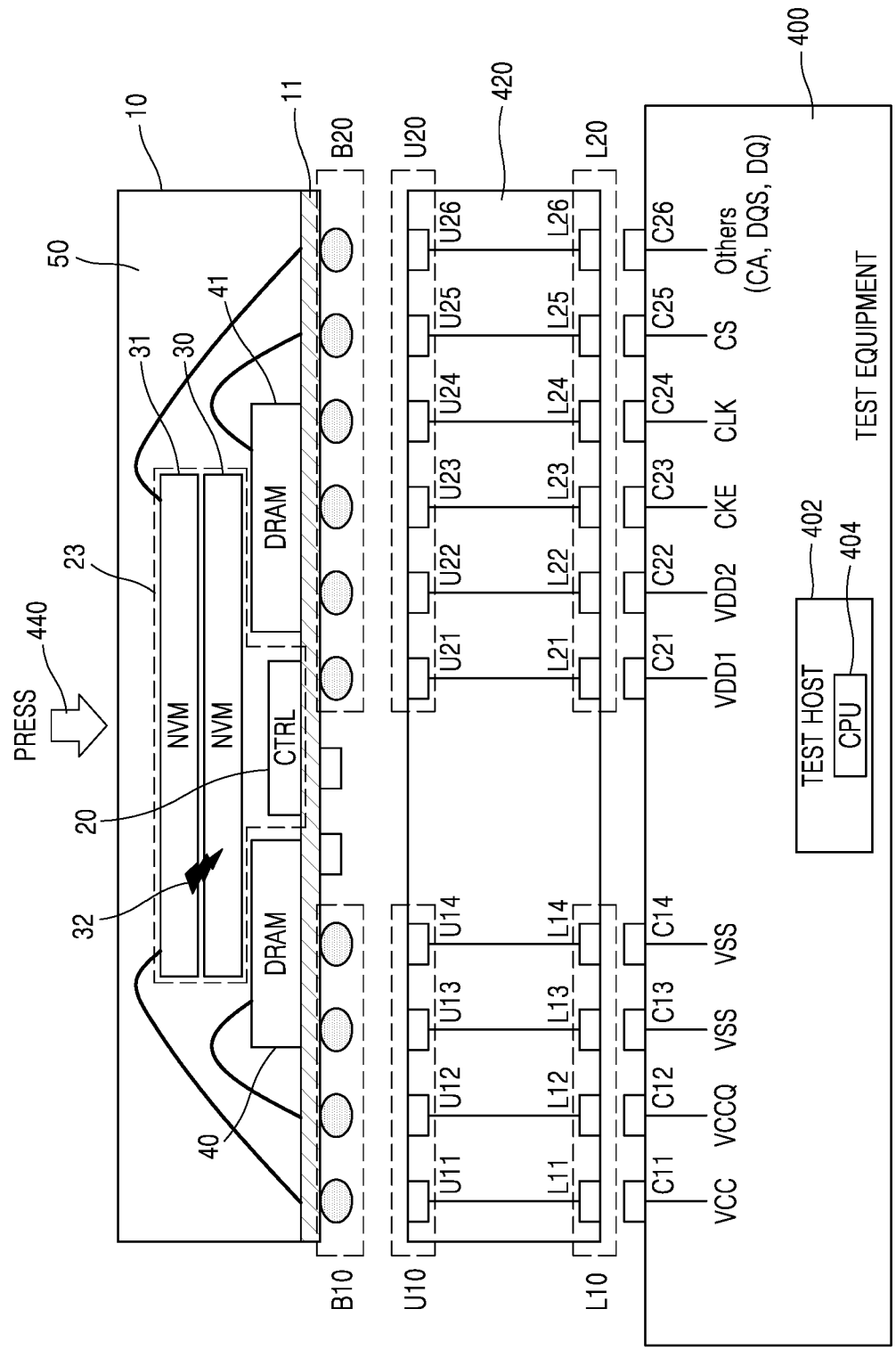
FIG. 4 is a diagram illustrating a test method of a storage device implemented in an MCP according to an embodiment of the inventive concept.

FIG. 4 is a diagram illustrating a test method of a storage device implemented in an MCP 10 according to an embodiment of the inventive concept. FIG. 4 shows a method, performed by test equipment 400, of testing the MCP 10 using a test board 420.

Referring to FIGS. 1 and 4, the MCP 10 may be disposed on the test equipment 400 with the test board 420 interposed therebetween. A predetermined pressure 440 may be applied from the top in order to improve the adhesion between the MCP 10, the test board 420, and the test equipment 400. A predetermined pressure 440 may be applied by a match plate. A crack 32 may occur in the NVMs 30 and 31 of a stack structure due to the predetermined pressure 440. Alternatively, the crack 32 may occur in the NVMs 30 and 31 in a process of loading the MCP 10 into the test equipment 400 or preparing for a test.

The test board 420 may include upper terminals U11 to U14 of a first group U10 and upper terminals U21 to U26 of a second group U20 on an upper surface thereof. The upper terminals U1f to U14 of the first group U10 may correspond to the package balls B11 to B14 of the first group B10 of the MCP 10, and the terminals U21 to U26 of the second group U20 may correspond to the package balls B21 to B26 of the second group B20.

The test board 420 may include lower terminals L11 to L14 of a first group L10 and lower terminals L21 to L26 of a second group L20 on a lower surface thereof. The lower terminals L11 to L14 of the first group L10 may correspond to the upper terminals U11 to U14 of the first group U10, and the lower terminals L21 to L26 of the second group L20 may correspond to the upper terminals U21 to U26 of the second group U20.

The lower terminals L11 to L14 of the first group L10 of the test board 420 may correspond to first channel terminals C11 to C14 of the test equipment 400, and the lower terminals L21 to L26 of the second group L20 may correspond to the second channel terminals C21 to C26 of the test equipment 400. The test equipment 400 may test the eStorage 23 including the memory controller 20 and the NNMs 30 and 31 using the first channel terminals C11 to C14, and test the DRAMs 40 and 41 using the second channel terminals C21 to C26.

The test equipment 400 may include a test host 402 that tests the MCP 10, which is a device under test (DUT). The test host 402 may include a central processing unit 404 that controls hardware, software, and firmware to perform a test operation on the MCP 10. The test host 402 may transmit a test signal of the central processing unit 404 to the MCP 10 or transmit a value of results of performing the test signal of the MCP 10 to the central processing unit 404.

The test host 402 may be implemented in a test program. The test program may include a test algorithm or pattern for performing the test operation. For example, the test host 402 may store specific data in a storage region of the DUT, read the specific data, and then determine a pass or failure of the test operation according to whether the read data is the same as the specific data. The test host 402 may measure a change in voltage/current/frequency under various driving conditions to test whether a range of the change is an allowable range.

The test host 402 may test whether the crack 32 of the NVMs 30 and 31 of the MCP 10 is defective using the first channel terminals C11 to C14. The test host 402 may apply the main power voltage VCC to the C11 channel terminal, apply the power voltage VCCQ to the channel terminal C12, and apply the ground voltage VSS to the remaining channel terminals C13 and C14. The ground voltage VSS applied to the channel terminal C13 may provide the hardware reset signal RST_n of the storage device 10 at a low level. Accordingly, when the storage device 10 transitions to the idle power state S330 and the first and second NVMs 30 and 31 enter the low power mode, the test host 402 may measure current flowing through the first channel terminals C11 to C14. The test host 402 may detect crack defects of the NVMs 30 and 31 based on the current measured in the first channel terminals C11 to C14. The test host 402 may determine crack defects of the NVMs 30 and 31 when the current measured in the first channel terminals C11 to C14 is greater than or equal to a test reference value.

The test host 402 may perform a function test of the DRAMs 40 and 41 using the second channel terminals C21 to C26. The test host 402 may apply the first power voltage VDD1 to the channel terminal C21, apply the second power voltage VDD2 to the channel terminal C22, apply the clock enable signal CKE to the C23 channel terminal, apply the clock signal CLK to the channel terminal C24, apply the chip select signal CS to the channel terminal C25, and apply the remaining signals (e.g., the command/address signal CA, the data strobe signal DQS, and the data input/output signal DQ) related to the DRAM chips 40 and 41 to the remaining channel terminal C26. The first power voltage VDD1 may have a value of about 2.1V, and the second power voltage VDD2 may have a value of about 1.5V lower than the first power voltage VDD1. The test host 402 may read test results of the DRAMs 40 and 41 and compare the test results with the test reference value to determine a pass or failure of the test operation.

When testing the DRAMs 40 and 41, the test host 402 may perform a low frequency function test on the DRAMs 40 and 41, and perform a high frequency function test on the DRAMs 40 and 41 that have passed the low frequency function test. The DRAM test efficiency may be improved by performing the function test on the DRAMs 40 and 41 that have passed the low frequency function test at the maximum speed. In this case, the test equipment for the low frequency function test and the test equipment for the high frequency function test may be different from each other.

Figure 5:
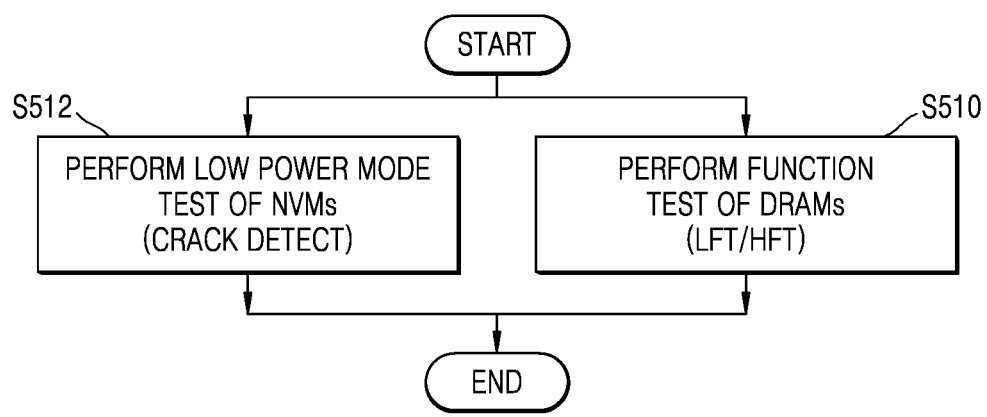
FIG. 5 is a flowchart illustrating a test method of a storage device implemented in an MCP according to an embodiment of the inventive concept.

FIG. 5 is a flowchart illustrating a test method of a storage device implemented in the MCP 10 according to an embodiment of the inventive concept.

Referring to FIGS. 4 and 5, the test host 402 may perform a function test S510 on the DRAMs 40 and 41 of the MCP 10 and a low power mode test S512 of the NVMs 30 and 31 for detecting a defect of the crack 32 in parallel. The test host 402 may perform the function test S510 on the DRAMs 40 and 41 using the second channel terminals C21 to C26 of the test equipment 400, and the low power mode test S512 of the NVMs 30 and 31 using the first channel terminals C11 to C14.

Figure 6:
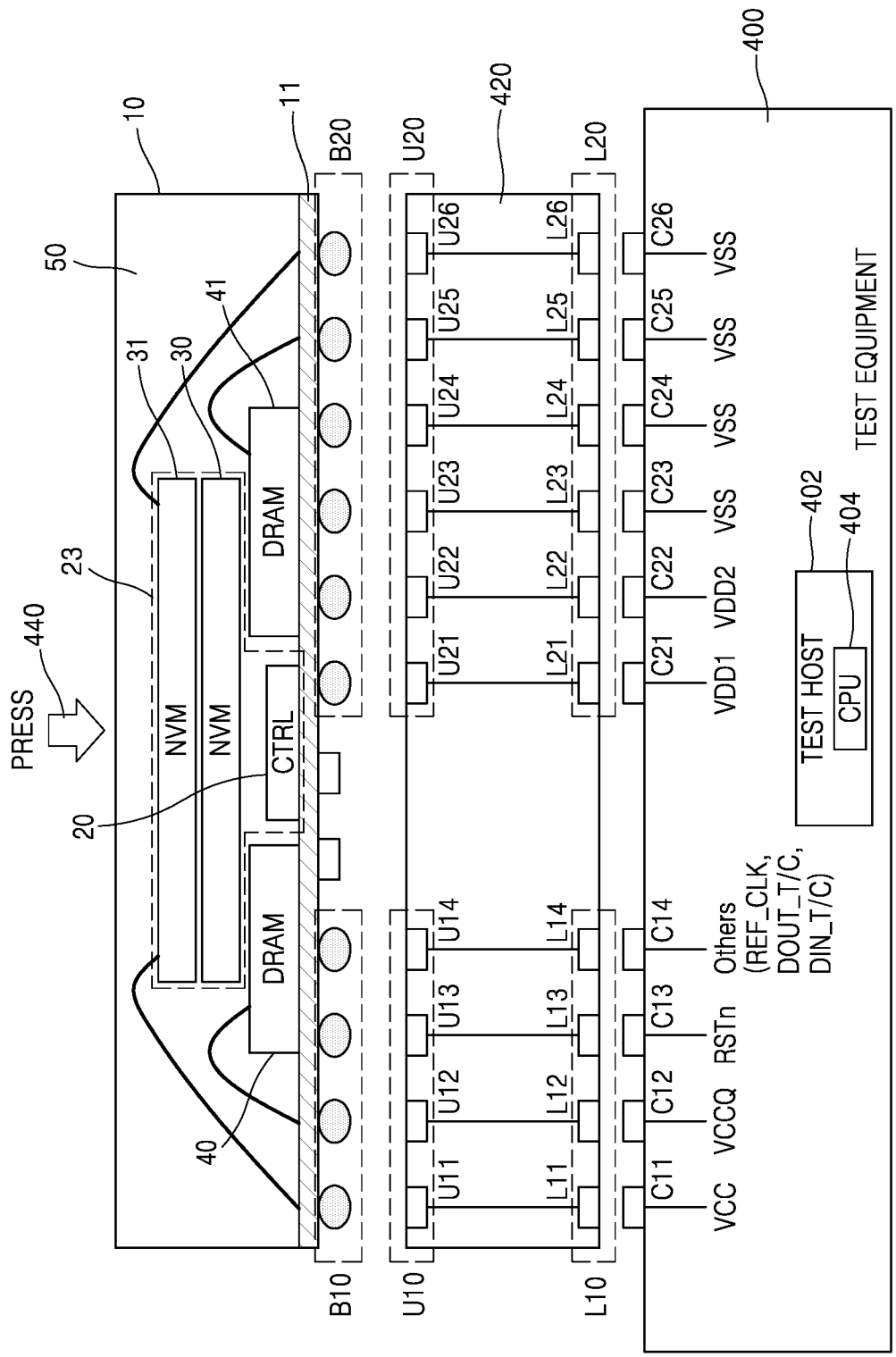
FIG. 6 is a diagram illustrating a test method of a storage device implemented in an MCP according to an embodiment of the inventive concept.

FIG. 6 is a diagram illustrating a test method of a storage device implemented in the MCP 10 according to an embodiment of the inventive concept. In FIG. 6, a function test operation on the eStorage 23 including the memory controller 20 and the NVMs 30 and 31 of the MCP 10 of FIG. 1 and a leakage current test operation on the DRAMs 40 and 41 are described. Hereinafter, descriptions redundant with those of FIG. 4 are omitted.

Referring to FIGS. 1 and 6, the test host 402 may perform a function test of the eStorage 23 including the memory controller 20 and the NVMs 30 and 31 of the MCP 10 using the first channel terminals C11 to C14. The test host 402 may apply the main power voltage VCC to the channel terminal C11, apply the power voltage VCCQ to the channel terminal C12, apply the hardware reset signal RST_n to the channel terminal C13, and apply a signal (e.g., the reference clock signal REF_CLK and the differential input signal DIN_T/C) related to the eStorage 23 to the remaining channel terminal C14. The test host 402 may read test results with respect to the eStorage 23 and compare test results to a test reference value to determine a pass or failure of a test operation. For example, the test host 402 may compare the differential output signal DOUT_T/C output as a result of the test operation to the differential input signal DIN_T/C to determine a pass or failure of the test operation.

The test host 402 may perform the leakage current test of the DRAMs 40 and 41 using the second channel terminals C21 to C26. The test host 402 may apply the first power voltage VDD1 to the channel terminal C21, apply the second power voltage VDD2 to the channel terminal C22, and apply the ground voltage VSS to the remaining channel terminals C23 to C26. The test host 402 may measure the current flowing through the second channel terminals C21 to C26. The test host 402 may detect the leakage current of the DRAMs 40 and 41 based on the current measured in the second channel terminals C21 to C26.

Figure 7:
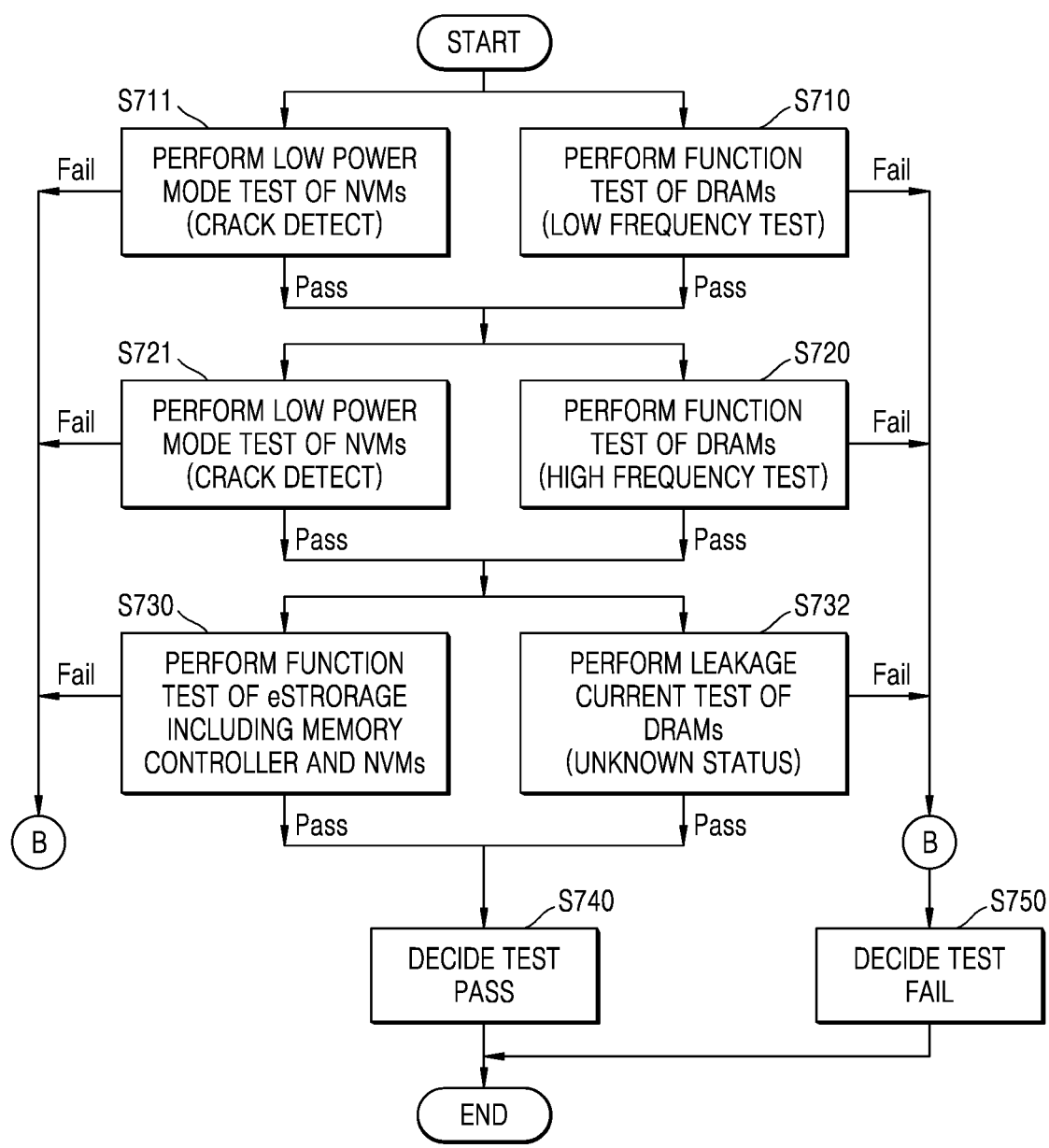
FIG. 7 is a flowchart illustrating a test method of a storage device implemented in an MCP according to an embodiment of the inventive concept.

FIG. 7 is a flowchart illustrating a test method of a storage device implemented in the MCP 10 according to an embodiment of the inventive concept. In FIG. 7, operation branching is performed according to test results of the MCP 10 by the test host 402. For convenience of explanation, when it is determined that the test passes, operation branching is moved to a pass direction and when it is determined that the test fails, operation branching is moved to a failure direction.

Referring to FIGS. 4, 6, and 7, in operation S710, as described in FIG. 4, the test host 402 may perform a low frequency function test of the DRAMs 40 and 41 using the second channel terminals C21 to C26 of the test equipment 400, and in operation S711, perform a low power mode test of the NVMs 30 and 31 using the first channel terminals C11 to C14 in parallel. The test host 402 may detect crack defects of the NVMs 30 and 31 based on the leakage current measured in the first channel terminals C11 to C14 during the low frequency function test S710 of the DRAMs 40 and 41. For example, the test host 402 may analyze a current measured in the first channel terminals C11 to C14 to determine if a crack defect exists in the NVMs 30 and 31. When the low frequency function test S710 of the DRAMs 40 and 41 passes and the crack defect is not detected in the low power mode test S711 of the NVMs 30 and 31, the procedure may move to operations S720 and S721. When the low frequency function test S710 of the DRAMs 40 and 41 fails or the crack defect is detected in the low power mode test S711 of the NVMs 30 and 31, it may be determined that test results fail (S750).

In operation S720, as described in FIG. 4, the test host 402 may perform a high-frequency function test of the DRAMs 40 and 41 using the second channel terminals C21 to C26 of the test equipment 400, and in operation S721, perform the low power mode test of the NVMs 30 and 31 using the first channel terminals C11 to C14 in parallel. For example, the test equipment 400 in operations S720 and S721 may be different from the test equipment 400 in operations S710 and S711. The test host 402 may detect crack defects of the NVMs 30 and 31 based on the leakage current measured in the first channel terminals C11 to C14 during the high frequency function test S720 of the DRAMs 40 and 41. For example, the test host 402 may analyze a current measured in the first channel terminals C11 to C14 to determine if a crack defect exists in the NVMs 30 and 31. When the high frequency function test S720 of the DRAMs 40 and 41 passes and the crack defect is not detected in the low power mode test S721 of the NVMs 30 and 31 (e.g., when the current measured in the first channel terminals C11 to C14 is less than the test reference value), the procedure may move to steps S730 and S731. When the high frequency function test S720 of the DRAMs 40 and 41 fails or the crack defect is detected in the low power mode test S712 of the NVMs 30 and 31 (e.g., when the current measured in the first channel terminals C11 to C14 is greater than or equal to a test reference value), it may be determined that test results fail (S750).

In operation S730, as described in FIG. 6, the test host 402 may perform a function test of the eStorage 23 including the memory controller 20 and the NVMs 30 and 31 using the first channel terminals C11 to C14 of the test equipment 400, and perform a leakage current test of the DRAMs 40 and 41 using the second channel terminals C21 to C26 in operation S731 in parallel. The test host 402 may detect a leakage current defect of the DRAMs 40 and 41 based on the current measured in the second channel terminals C21 to C26 during the function test S730 of the eStorage 23. When the function test S730 of the eStorage 23 passes and a leakage current defect of the DRAMs 40 and 41 is not detected, it may be determined that test results pass (S740). When the high frequency function test S720 of the DRAMs 40 and 41 fails or a crack defect is detected in the low power mode test S721 of the NVMs 30 and 31, it may be determined that test results fail (S750).

While testing the DRAMs 40 and 41 through the above-described test method of the MCP 10, the crack defect of the NVMs 30 and 31 may be performed. In addition, the subsequent test is performed on the MCP 10 of a good quality, which may improve the test efficiency and thus the test productivity may be improved. For example, the test host 402 may detect a crack defect of the NVMs 30 and 31 during performing a function test of the DRAMs 40 and 41 thus a test condition can change to improve the crack defect and a test time of the MCP 10 may be reduced.

Although not shown in FIG. 7, several operations may be provided to place the MCP 10 on the test equipment. For example, in operation S701, the memory controller chip 20, the NVM chips 30 and 31, and the DRAM chips 40 and 41 may be prepared, in operation S702, the provided memory controller chip 20 and the DRAM chips 40 and 41 may be mounted on the package substrate 11, in operation S703, the provided NVM chips 30 and 31 may be mounted on the DRAM chips 40 and 41, and in operation S704, the mold layer 50 may be provided to cover the memory controller chip 20, the NVM chips 30 and 31, and the DRAM chips 40 and 41. For example, the MCP 10 may be fabricated when the test result is determined to pass through operations S701 to S704, S710, S711, S720, S721, S730, S732, S740, and one or more additional operations (not shown).

Figure 8:
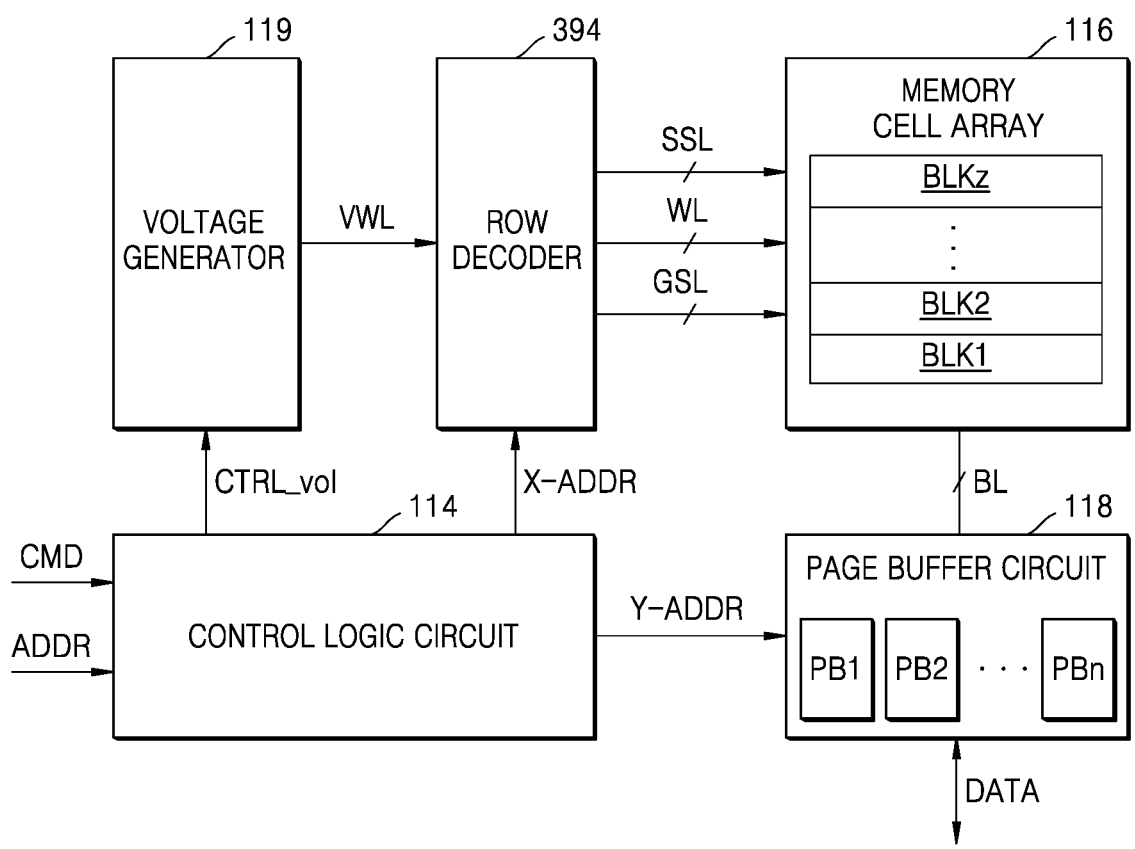
FIG. 8 is an example block diagram illustrating a first nonvolatile memory (NVM) of FIG. 1 according to an embodiment of the inventive concept.

FIG. 8 is an example block diagram illustrating the first NVM 30 of FIG. 1.

Referring to FIG. 8, the first NVM 30 may include a control logic circuit 114, a memory cell array 116, a page buffer circuit 118, a voltage generator 119, and a row decoder 394. Although not shown in FIG. 8, the first NVM 30 may further include a command decoder, an address decoder, and an input/output buffer.

The control logic circuit 114 may generally control various operations within the first NVM 30. The control logic circuit 114 may output various control signals in response to the command CMD and/or the address ADDR from the memory controller 20. For example, the control logic circuit 114 may output a voltage control signal CTRL_vol, a row address X-ADDR, and a column address Y-ADDR.

The memory cell array 116 may include a plurality of memory blocks BLK1 to BLKz, and each of the plurality of memory blocks BLK1 to BLKz may include a plurality of memory cells. The memory cell array 116 may be connected to the page buffer circuit 118 through bit lines BL, and connected to the row decoder 394 through word lines WL, string selection lines SSL, and ground selection lines GSL.

In an embodiment, the memory cell array 116 may include a 3-Dimensional (3D) memory cell array, and the 3D memory cell array may include a plurality of memory NAND strings. Each memory NAND string may include memory cells connected to the word lines WL vertically stacked on a substrate. U.S. Pat. Nos. 7,679,133, 8,553,466, 8,654,587, 8,559,235, and U.S. Patent Publication No. 2011/0233648 are incorporated herein by reference. In an embodiment, the memory cell array 116 may include a 2D memory cell array, and the 2D memory cell array may include a plurality of memory NAND strings arranged in row and column directions.

The page buffer circuit 118 may include a plurality of page buffers PB1 to PBn (n is an integer equal to or greater than 2), and the plurality of page buffers PB1 to PBn may be respectively connected to memory cells through the plurality of bit lines BL. The page buffer circuit 118 may select at least one bit line BL from among the bit lines BL in response to the column address Y-ADDR. The page buffer circuit 118 may operate as a write driver or a sense amplifier according to an operation mode. For example, during a program operation, the page buffer circuit 118 may apply a bit line voltage corresponding to data DATA to be programmed to the selected bit line BL. During a read operation, the page buffer circuit 118 may sense the current or voltage of the selected bit line BL to sense the data DATA stored in the memory cell.

The voltage generator 119 may generate various types of voltages for performing program, read, and erase operations based on a voltage control signal CTRL_vol. For example, the voltage generator 119 may generate a program voltage, a read voltage, a program verify voltage, an erase voltage, etc. as a word line voltage VWL.

The row decoder 394 may select one of the plurality of word lines WL in response to the row address X-ADDR and may select one of the plurality of string selection lines SSL. For example, during a program operation, the row decoder 394 may apply the program voltage and the program verify voltage to the selected word line WL, and may apply a read voltage to the selected word line WL during a read operation.

Figure 9:
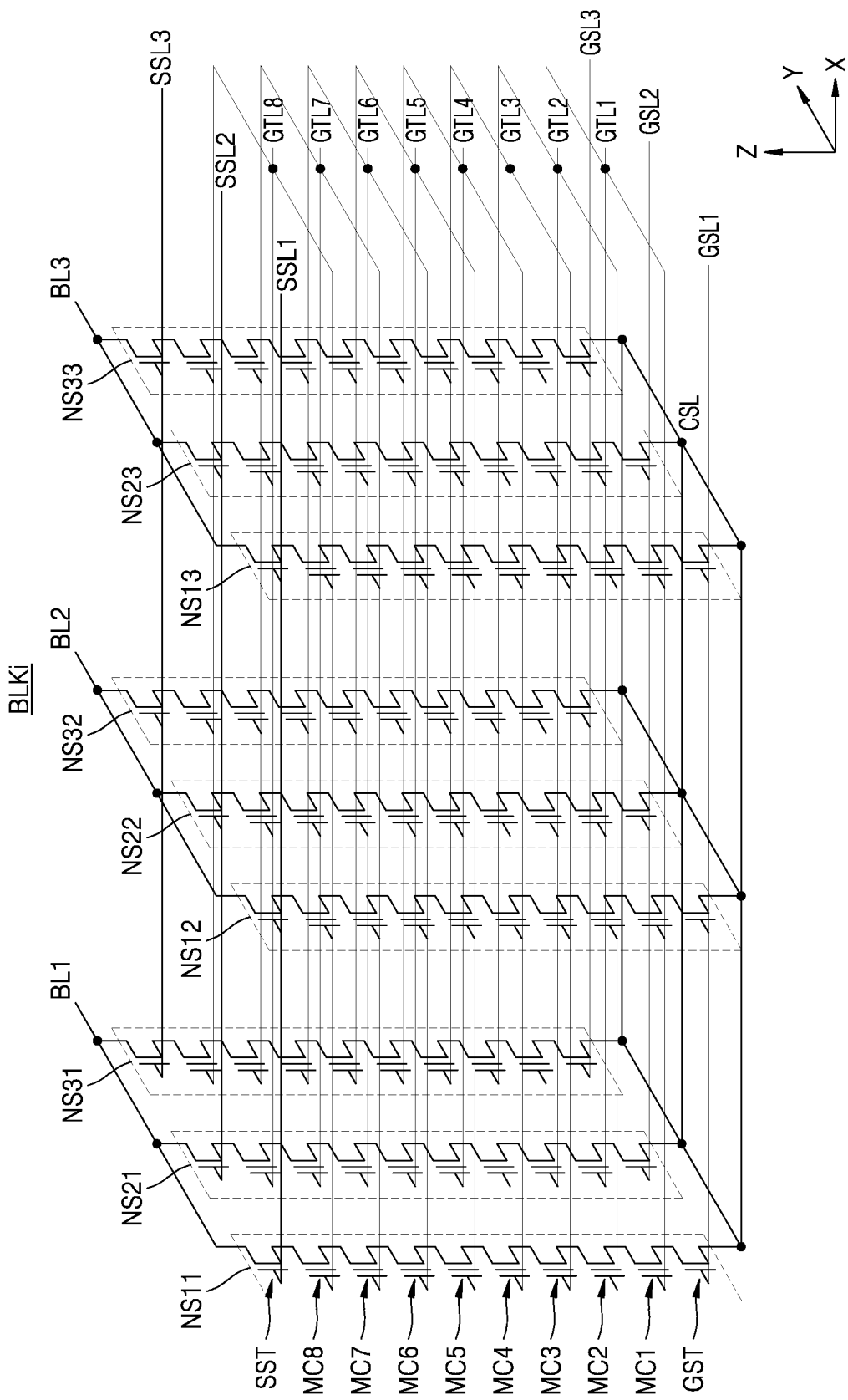
FIGS. 9 to 11 are diagrams illustrating a 3D V-NAND structure applicable to the first NVM of FIG. 1 according to example embodiments.
Figure 10:
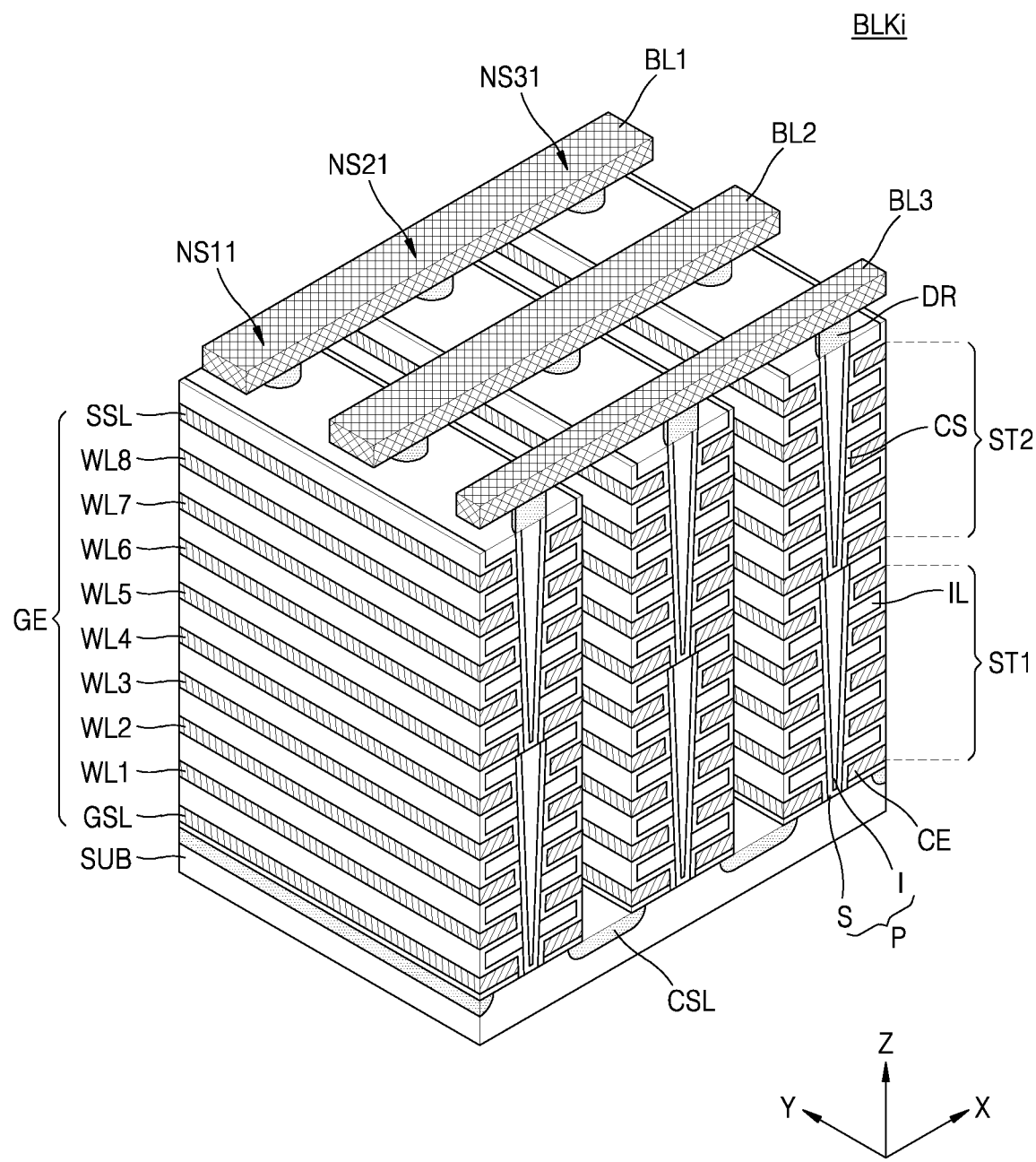
Figure 11:
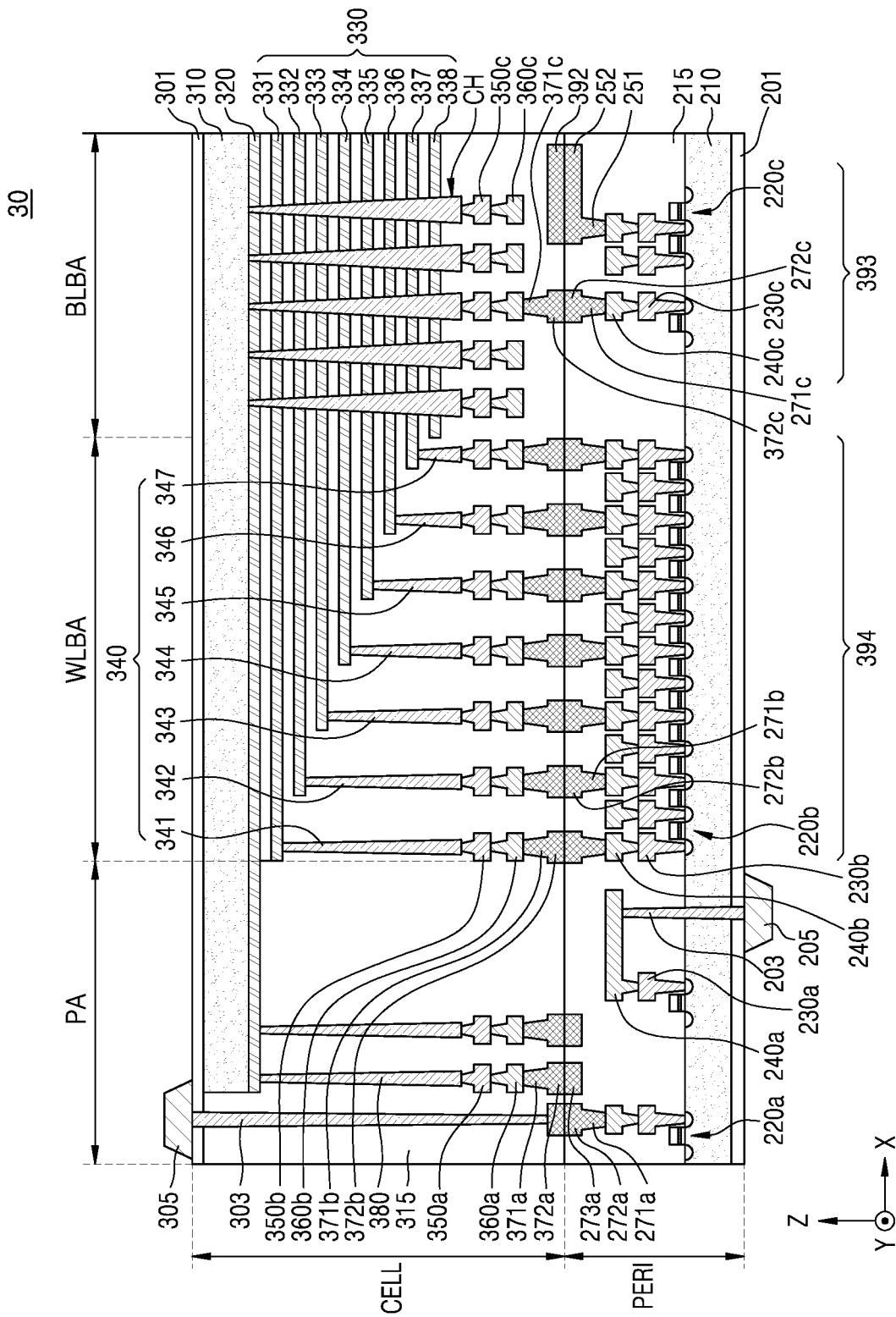

FIGS. 9 to 11 are diagrams for explaining a 3D Vertical-NAND (V-NAND) structure applicable to the first NVM 30 of FIG. 1 according to example embodiments. FIG. 9 illustrates an equivalent circuit of a memory block BLKi, and FIG. 10 illustrates a perspective view of the memory block BLKi. FIG. 11 illustrates a first NVM 30 of a chip to chip (C2C) structure.

Referring to FIG. 9, the memory block BLKi may include a plurality of memory NAND strings NS11 to NS31, NS12 to NS32, and NS13 to NS33, respectively connected between bit lines BL1, BL2, and BL3 and the common source line CSL. Each string of the plurality of memory NAND strings NS11 to NS31, NS12 to NS32, and NS13 to NS33 may include a string selection transistor SST, a plurality of memory cells MC1, MC2, . . . , and MC8, and a ground selection transistor GST. For the brevity of drawings, in FIG. 9, each string of the plurality of memory NAND strings NS11 to NS31, NS12 to NS32, and NS13 to NS33 includes eight memory cells MC1, MC2, . . . , and MC8, but is limited thereto.

The string selection transistor SST may be connected to corresponding string selection lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines WL (e.g., WL1, WL2, . . . , and WL8), and some of the gate lines GTL1, GTL2, . . . , and GTL8 may correspond to dummy word lines. The ground selection transistor GST may be connected to corresponding ground selection lines GSL1, GSL2, and GSL3. The string selection transistor SST may be connected to the corresponding bit lines BL1, BL2, and BL3, and the ground selection transistor GST may be connected to the common source line CSL.

A gate line (e.g., GTL1) of the same height may be commonly connected, and the ground selection lines GSL1, GSL2, and GSL3 and the string selection lines SSL1, SSL2, and SSL3 may be separated from each other. In FIG. 9, the memory block BLK is connected to the eight gate lines GTL1, GTL2, . . . , and GTL8 and the three bit lines BL1, BL2, and BL3, but is limited thereto. no.

Referring to FIGS. 9 and 10, the memory block BLKi is formed in a direction perpendicular to a substrate SUB. The memory cells constituting the memory NAND strings NS11 to NS31, NS12 to NS32, and NS13 to NS33 are formed by stacking on a plurality of semiconductor layers.

The common source line CSL extending along a first direction (Y direction) is provided on the substrate SUB. On a region of the substrate SUB between two adjacent common source lines CSL, a plurality of insulating layers IL extending in the first direction (Y direction) may be sequentially provided in a third direction (Z direction) and may be spaced apart by a specific distance in the third direction (Z direction). On a region of the substrate SUB between two adjacent common source lines CSL, a plurality of pillars P may be sequentially disposed in the first direction (Y direction) and may penetrate the plurality of insulating layers IL in the third direction (Z direction). The plurality of pillars P may penetrate the plurality of insulating layers IL to make contact the substrate SUB. A surface layer S of each pillar P may include a silicon material doped with a first conductivity type, and may function as a channel region. An inner layer I of each pillar P may include an insulating material such as silicon oxide or an air gap. In a region between the two adjacent common source lines CSL, a charge storage layer CS is provided along exposed surfaces of the insulating layers IL, the pillars P, and the substrate SUB. The charge storage layer CS may include a gate insulating layer (or referred to as a 'tunneling insulating layer'), a charge trap layer, and a blocking insulating layer. In addition, in a region between two adjacent common source lines CSL, on the exposed surface of the charge storage layer CS, a gate electrodes GE such as the selection lines GSL and SSL and the word lines WL1 to WL8 is provided. Drains or drain contacts DR may be provided on the plurality of pillars P, respectively. The bit lines BL1 to BL3 extending in a second direction (X direction) and spaced apart by a specific distance in the first direction (Y direction) may be provided on the drain contacts DR.

As illustrated in FIG. 10, each string of the memory NAND strings NS11 to NS31, NS12 to NS32, and NS13 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack are ST2 are stacked to share a channel hole with each other.

Referring to FIG. 11, the first NVM 30 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the first NVM 30 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, each of the circuit elements 220a, 220b, and 220c may correspond to one or more transistors. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrated in FIG. 11, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. Although not shown in FIG. 11, at least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 11, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different from operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 11, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 11, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to example embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 11, the second input-output contact plug 303 may be separated from the second substrate 310 in a direction, parallel to the upper surface of the second substrate 310, and may pass through an interlayer insulating layer 315 of the cell region CELL to be connected to the second input-output pad 305.

According to embodiments, the first input-output pad 205 and the second input-output pad 305 may be selectively formed. For example, the first NVM 30 may include only the first input-output pad 205 disposed on the first substrate 210 or the second input-output pad 305 disposed on the second substrate 310. Alternatively, the first NVM 30 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the first NVM 30 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In example embodiments, a memory cell array or a memory block described with reference to FIGS. 2 and 8 to 10 may be included in the cell region CELL. Peripheral circuits (e.g., the control logic circuit 114, the page buffer circuit 118, the voltage generator 119, and the row decoder 394) described with reference to FIG. 8 may be included in the peripheral circuit region PERI.

Figure 12:
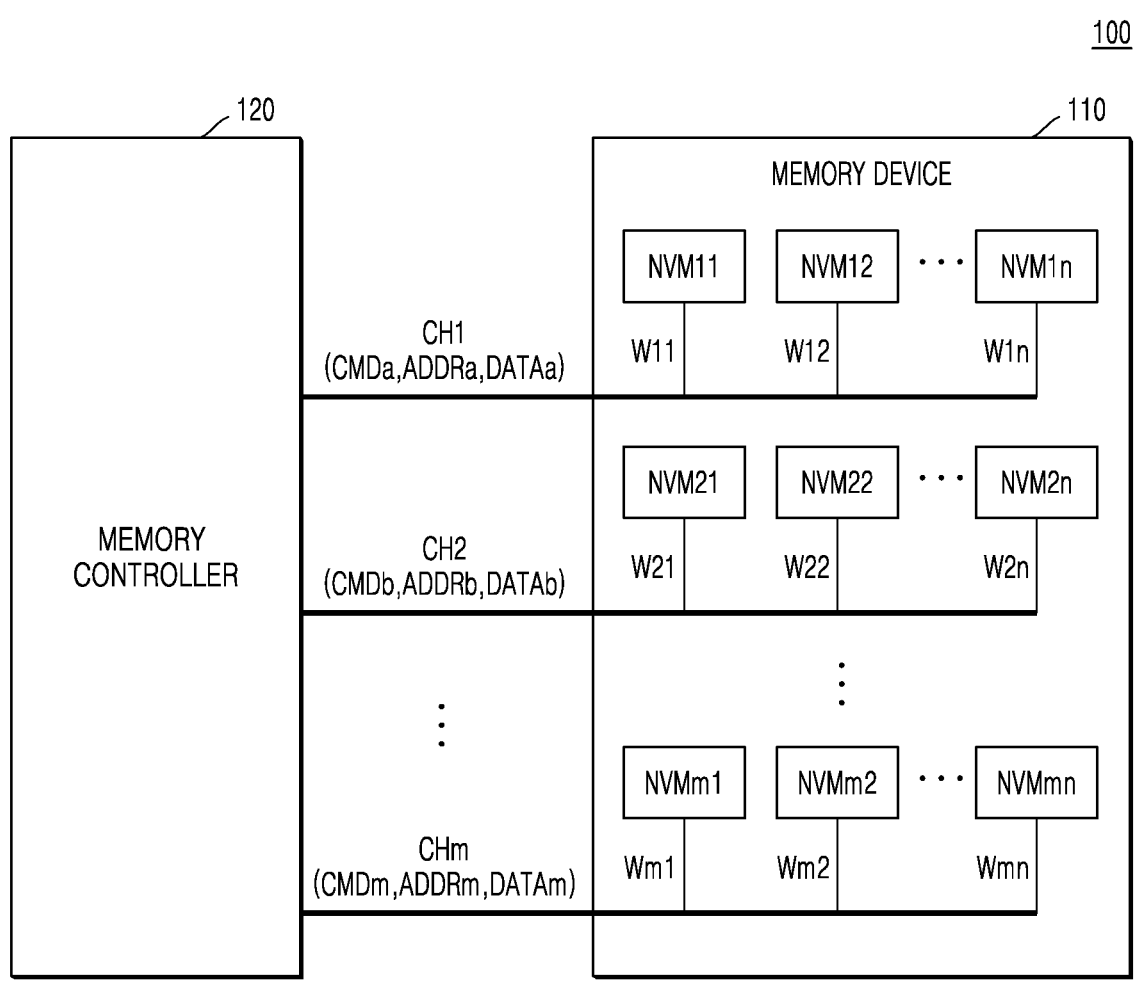
FIG. 12 is a block diagram illustrating a storage device according to an embodiment of the inventive concept.

FIG. 12 is a block diagram illustrating a storage device 100 according to an embodiment of the inventive concept.

Referring to FIG. 12, the storage device 100 may include a memory device 110 and a memory controller 120. In the present embodiment, multiple conceptual hardware configurations are included in the storage device 100, but are not limited thereto, and other configurations are possible. The memory controller 120 may control the memory device 110 to write data to the memory device 110 in response to a write request from a host, or may control the memory device 110 to read the data stored in the memory device 110 in response to a read request from the host.

In some embodiments, the storage device 100 may be an internal memory embedded in an electronic device. For example, the storage device 100 may be an embedded universal flash storage (UFS) memory device, an embedded multi-media card (eMMC), or a solid state drive (SSD). However, the inventive concept is not limited thereto, and the storage device 100 may be an NVM (e.g., One Time Programmable ROM (OTPROM), Programmable ROM (PROM), Erasable and Programmable ROM (EPROM)), and Electrically Erasable (EEPROM). and Programmable ROM), Mask ROM, Flash ROM, etc.) In some embodiments, the storage device 100 may be an external memory detachable from the electronic device. For example, the storage device 100 may include at least one of a UFS memory card, Compact Flash (CF), Secure Digital (SD), Micro Secure Digital (Micro-SD), Mini Secure Digital (Mini-SD), extreme digital (xD), and Memory Stick.

The storage device 100 may support a plurality of channels CH1 to CHm, and the memory device 110 and the memory controller 120 may be connected to each other through the plurality of channels CH1 to CHm. Herein, m is a natural number greater than 1. The memory device 110 may include a plurality of nonvolatile memory devices NVM11 to NVM1n, NVM21 to NVM2n, . . . , and NVMm1 to NVMmn. Herein, n is a natural number greater than 1. Each memory device of the nonvolatile memory devices NVM11 to NVM1n, NVM21 to NVM2n, . . . , and NVMm1 to NVMmn may be connected to one of the plurality of channels CH1 to CHm through a corresponding way. For example, the nonvolatile memory devices NVM11 to NVM1n may be connected to the first channel CH1 through ways W11 to W1n, and the nonvolatile memory devices NVM21 to NVM2n may be connected to the second channel CH2 through ways W21 to W2n. In an embodiment, each memory device of the nonvolatile memory devices NVM11 to NVM1n, NVM21 to NVM2n, . . . , and NVMm1 to NVMmn may be implemented in an arbitrary memory unit capable of operating according to an individual command from the memory controller 120. For example, each memory device of the nonvolatile memory devices NVM11 to NVM1n, NVM21 to NVM2n, . . . , and NVMm1 to NVMmn may be implemented in a chip or a die, but the inventive concept is not limited thereto.

The memory controller 120 may transmit and receive signals to and from the memory device 110 through the plurality of channels CH1 to CHm. For example, the memory controller 120 may transmit commands CMDa to CMDm, addresses ADDRa to ADDRm, and data DATAa to DATAm to the memory device 110 or may receive the data DATAa to DATAm from the memory device 110, through the channels CH1 to CHm.

The memory controller 120 may select one of nonvolatile memory devices connected to the corresponding channel through each channel, and transmit/receive signals to and from the selected nonvolatile memory device. For example, the memory controller 120 may select a first nonvolatile memory device NVM11 from among the nonvolatile memory devices NVM11 to NVM1n connected to the first channel CH1. The memory controller 120 may transmit the command CMDa, the address ADDRa, and the data DATAa to the selected nonvolatile memory device NVM11, or may receive the data DATAa from the selected nonvolatile memory device NVM11, through the first channel CH1.

The memory controller 120 may transmit and receive signals to and from the memory device 110 in parallel through different channels. For example, while transmitting the command CMDa to the memory device 110 through the first channel CH1, the memory controller 120 may transmit the command CMDb to the memory device 110 through the second channel CH2. For example, the memory controller 120 may receive the data DATAb from the memory device 110 through the second channel CH2 while receiving the data DATAa from the memory device 110 through the first channel CH1.

The memory controller 120 may control the overall operation of the memory device 110. The memory controller 120 may transmit signals to the channels CH1 to CHm to control each memory device of the nonvolatile memory devices NVM11 to NVM1n, NVM21 to NVM2n, . . . , and NVMm1 to NVMmn connected to the channels CH1 to CHm. For example, the memory controller 120 may transmit the command CMDa and the address ADDRa through the first channel CH1 to control a selected one of the nonvolatile memory devices NVM11 to NVM1n.

Each memory device of the nonvolatile memory devices NVM11 to NVM1n, NVM21 to NVM2n, . . . , and NVMm1 to NVMmn may operate under the control of the memory controller 120. For example, the first nonvolatile memory device NVM11 may program the data DATAa according to the command CMDa, the address ADDRa, and the data DATAa provided through the first channel CH1. For example, a second nonvolatile memory device NVM21 may read the data DATAb according to the command CMDb and the address ADDRb provided through the second channel CH2 and transmit the read data DATAb to the memory controller 120.

The memory controller 120 may transmit a command with respect to a second nonvolatile memory device NVM12 to the second nonvolatile memory device NVM12 through a data signal line of the first channel CH1 while receiving output data output from the first nonvolatile memory device NVM11 among the nonvolatile memory devices NVM11 to NVM1n connected to one channel, for example, the first channel CH1, through a data signal line included in the first channel CH1. The memory controller 120 may change a voltage level of the data signal line of the first channel CH1 based on a command with respect to the second nonvolatile memory device NVM12. Accordingly, the output data output from the first nonvolatile memory device NVM11 may be loaded on the data signal line of the first channel CH1 having the changed voltage level state, and output data of the first nonvolatile memory device NVM11 and command of the second nonvolatile memory device NVM12 may be transmitted in both directions of the data signal line of the first channel CH1.

In FIG. 12, the memory device 110 communicates with the memory controller 120 through m channels, and the memory device 110 includes n nonvolatile memory devices corresponding to each channel, but the number of channels and the number of nonvolatile memory devices connected to one channel may be variously changed.

Figure 13:
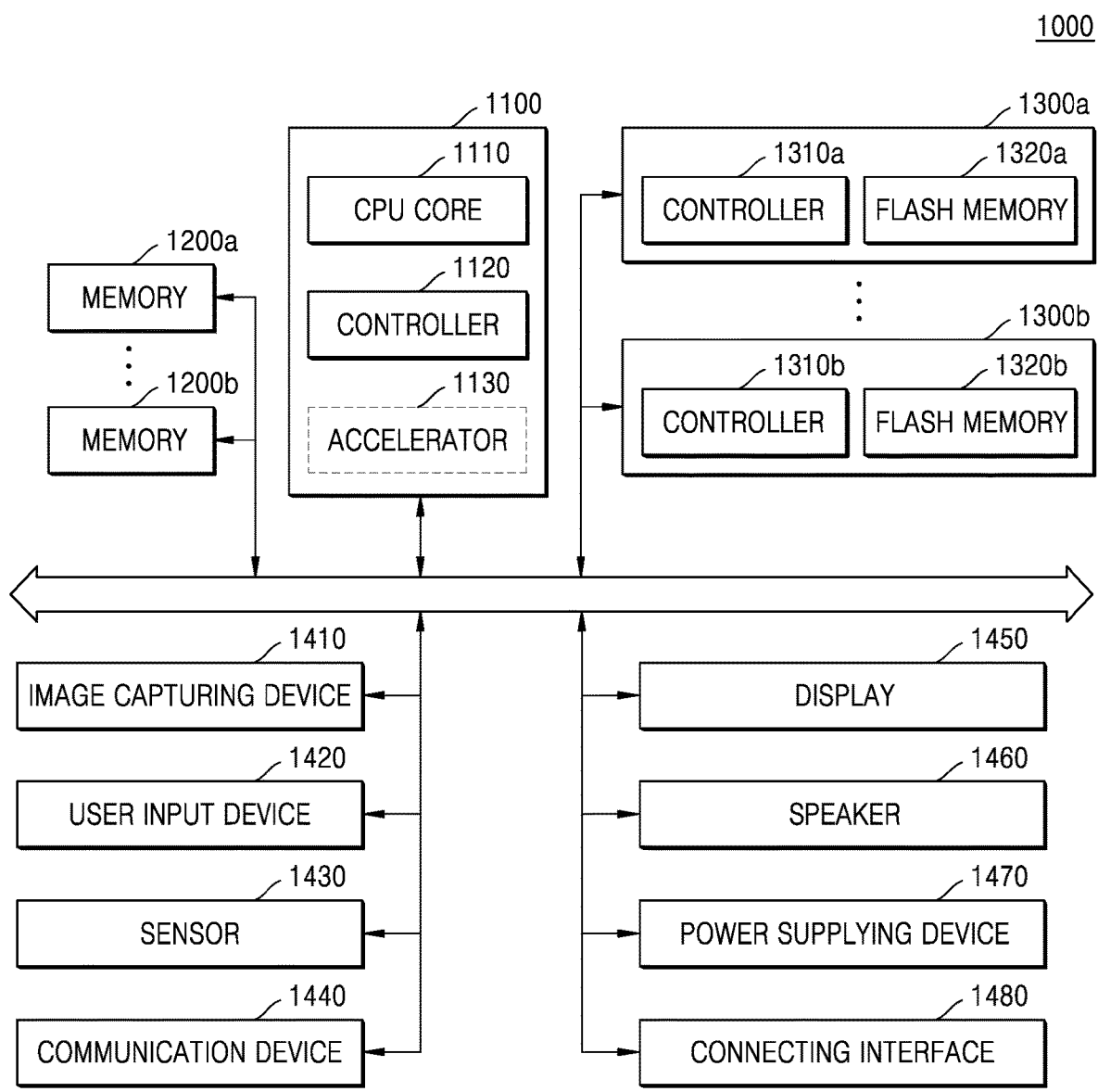
FIG. 13 is a diagram illustrating a system to which storage devices are applied according to embodiments of the inventive concept.

FIG. 13 is a diagram illustrating a system 1000 to which storage devices 1300a and 1300b are applied according to embodiments of the inventive concept. The system 1000 of FIG. 13 may be basically a mobile system such as a mobile phone, a smart phone, a tablet personal computer, a wearable device, a healthcare device, or an Internet of things (IOT) device. However, the system 1000 of FIG. 13 is not necessarily limited to the mobile system, and may be a personal computer, a laptop computer, a server, a media player, or an automotive device such as a navigation system.

Referring to FIG. 13, the system 1000 may include a main processor 1100, memories 1200a and 1200b, and the storage devices 1300a and 1300b, and, additionally, may include at least one of an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, more specifically, operations of other components constituting the system 1000. The main processor 1100 may be implemented in a general-purpose processor, a dedicated processor, or an application processor.

The main processor 1100 may include one or more CPU cores 1110, and may further include a controller 1120 for controlling the memories 1200a and 1200b and/or the storage devices 1300a and 1300b. Depending on an embodiment, the main processor 1100 may further include an accelerator block 1130, which is a dedicated circuit for a highspeed data operation such as an artificial intelligence (AI) data operation. Such an accelerator block 1130 may include a graphics processing unit (GPU), a neural processing unit (NPU), and/or a data processing unit (DPU), and may be implemented in a chip physically independent and separated from other components of the main processor 1100.

The memories 1200a and 1200b may be used as main memory devices of the system 1000 and may include volatile memories such as static random access memory (SRAM) and/or DRAM, but may include nonvolatile memories such as flash memory, PRAM, and/or RRAM. The memories 1200a and 1200b may be implemented in the same package as the main processor 1100.

The storage devices 1300a and 1300b may function as nonvolatile storage devices that store data regardless of whether power is supplied, and may have a relatively larger storage capacity than the memories 1200a and 1200b. The storage devices 1300a and 1300b may include storage controllers 1310a and 1310b and NVM storages 1320a and 1320b that store data under the control of the storage controllers 1310a and 1310b. The nonvolatile storage 1320a and 1320b may include a V-NAND flash memory of a 2-dimensional (2D) structure or a 3-dimensional (3D), but may also include other types of nonvolatile memory such as PRAM and/or RRAM.

The storage devices 1300a and 1300b may be included in the system 1000 while being physically separated from the main processor 1100, or may be implemented in the same package as the main processor 1100. In addition, the storage devices 1300a and 1300b have the same shape as a memory card, so that the storage devices 1300a and 1300b may be detachably coupled with other components of the system 1000 through an interface such as the connecting interface 1480 to be described later. The storage devices 1300a and 1300b may be devices to which standard rules such as universal flash storage (UFS) are applied, but are not necessarily limited thereto.

The image capturing device 1410 may capture a still image or a moving picture, and may be a camera, a camcorder, and/or a webcam.

The user input device 1420 may receive various types of data input from a user of the system 1000, and may be a touch pad, a keypad, a keyboard, a mouse, and/or a microphone.

The sensor 1430 may sense various types of physical quantities that may be obtained from outside the system 1000 and convert the sensed physical quantities into electrical signals. The sensor 1430 may be a temperature sensor, a pressure sensor, an illuminance sensor, a position sensor, an acceleration sensor, a biosensor, and/or a gyroscope.

The communication device 1440 may transmit and receive signals with other devices outside the system 1000 according to various communication protocols. The communication device 1440 may include an antenna, a transceiver, and/or a modem.

The display 1450 and the speaker 1460 may function as output devices that output visual information and audio information to the user of the system 1000, respectively.

The power supplying device 1470 may appropriately convert power supplied from a battery (not shown) embedded in the system 1000 and/or from an external power source to supply the power to each component of the system 1000.

The connecting interface 1480 may provide a connection between the system 1000 and an external device connected to the system 1000 and capable of exchanging data with the system 1000. The connecting interface 1480 may be implemented in various interface methods such as an advanced technology attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), and a compact flash (CF) card interface.

In example embodiments, the main processor 1100, the memories 1200a and 1200b, and the storage devices 1300a and 1300b of the system 1000 may correspond to the MCP 10 of FIGS. 1 and 2. In other example embodiments, the memories 1200a and 1200b and the storage devices 1300a and 1300b of the system 1000 may correspond to the MCP 10 of FIGS. 1 and 2.

Figure 14:
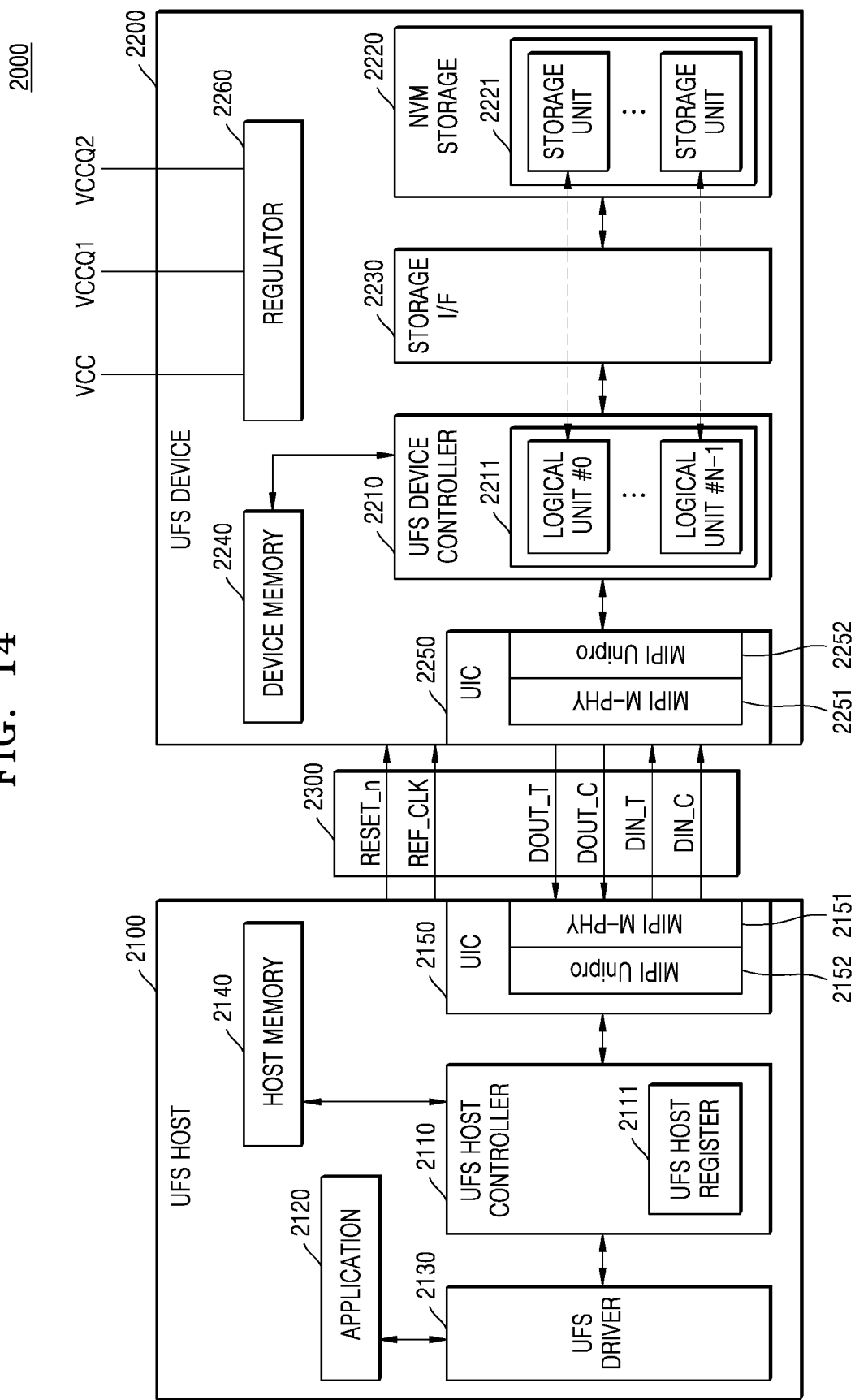
FIG. 14 is a diagram illustrating a universal flash storage (UFS) system according to an embodiment of the inventive concept.

FIG. 14 is a diagram illustrating a UFS system 2000 according to an embodiment of the inventive concept. The UFS system 2000 is a system conforming to the UFS standard announced by the Joint Electron Device Engineering Council (JEDEC), and may include a UFS host 2100, a UFS device 2200, and a UFS interface 2300. The above description of the system 1000 of FIG. 13 may also be applied to the UFS system 2000 of FIG. 14 within a range that does not conflict with the following description of FIG. 14.

Referring to FIG. 14, the UFS host 2100 and the UFS device 2200 may be interconnected through the UFS interface 2300. When the main processor 1100 of FIG. 13 is an application processor, the UFS host 2100 may be implemented in a part of the corresponding application processor. A UFS host controller 2110 and a host memory 2140 may correspond to the controller 1120 and the memories 1200a and 1200b of the main processor 1100 of FIG. 13, respectively. The UFS device 2200 may correspond to the storage devices 1300a and 1300b of FIG. 13, and the UFS device controller 2210 and the nonvolatile storage 2220 may correspond to the storage devices 1310a and 1310b and the NVM storages 1320a and 1320b of FIG. 13, respectively.

The UFS host 2100 may include the UFS host controller 2110, an application 2120, a UFS driver 2130, a host memory 2140, and a UFS interconnect (UIC) layer 2150. The UFS device 2200 may include a UFS device controller 2210, a nonvolatile storage 2220, a storage interface 2230, a device memory 2240, a UIC layer 2250, and a regulator 2260. The nonvolatile storage 2220 may include a plurality of storage units 2221, and the storage unit 2221 may include the V-NAND flash memory of the 2D structure or the 3D structure, but may include other types of nonvolatile memory such as PRAM and/or RRAM. The UFS device controller 2210 and the nonvolatile storage 2220 may be connected to each other through the storage interface 2230. The storage interface 2230 may be implemented to comply with a standard convention such as a toggle or ONFI.

The application 2120 may refer to a program that wants to communicate with the UFS device 2200 in order to use the function of the UFS device 2200. The application 2120 may transmit an input-output request (IOR) to the UFS driver 2130 for input/output to the UFS device 2200. The IOR may mean a data read request, a data write request, and/or a data discard request, but is not necessarily limited thereto.

The UFS driver 2130 may manage the UFS host controller 2110 through a host controller interface (UFS-HCI). The UFS driver 2130 may convert the IOR generated by the application 2120 into a UFS command defined by the UFS standard, and transmit the converted UFS command to the UFS host controller 2110. One IOR may be converted into a plurality of UFS commands. The UFS command may basically be a command defined by the SCSI standard, but may also be a UFS standard only command.

The UFS host controller 2110 may transmit the UFS command converted by the UFS driver 2130 to the UIC layer 2250 of the UFS device 2200 through the UIC layer 2150 and the UFS interface 2300. In this process, a UFS host register 2111 of the UFS host controller 2110 may serve as a command queue (CQ).

The UIC layer 2150 on the UFS host 2100 side may include a MIPI M-PHY 2151 and a MIPI UniPro 2152, and the UIC layer 2250 on the UFS device 2200 side may also include the MIPI M-PHY 2151 and the MIPI UniPro 2152.

The UFS interface 2300 may include a line transmitting the reference clock signal REF_CLK, a line transmitting the hardware reset signal RESET_n with respect to the UFS device 2200, a pair of lines transmitting differential input signal pairs DIN_t and DIN_c, and a pair of lines transmitting differential output signal pairs DOUT_t and DOUT_c.

A frequency value of the reference clock signal REF_CLK provided from the UFS host 2100 to the UFS device 2200 may be one of four values of 19.2 MHz, 26 MHz, 38.4 MHz, and 52 MHz, but is not limited thereto. The UFS host 2100 may change the frequency value of the reference clock signal REF_CLK during operation, that is, while data transmission/reception is performed between the UFS host 2100 and the UFS device 2200. The UFS device 2200 may generate clocks of various frequencies from the reference clock signal REF_CLK provided from the UFS host 2100 using a phase-locked loop (PLL). Also, the UFS host 2100 may set a value of a data rate between the UFS host 2100 and the UFS device 2200 through the frequency value of the reference clock signal REF_CLK. That is, the value of the data rate may be determined depending on the frequency value of the reference clock signal REF_CLK.

The UFS interface 2300 may support multiple lanes, and each lane may be implemented in a differential pair. For example, the UFS interface 2300 may include one or more receive lanes and one or more transmit lanes. In FIG. 14, the pair of lines transmitting the differential input signal pair DIN_T and DIN_C may constitute a receive lane, and the pair of lines transmitting the differential output signal pair DOUT_T and DOUT_C may constitute a transmit lane. FIG. 14 illustrates one transmit lane and one receive lane, but the number of transmit lanes and receive lanes may be changed.

The receive lane and the transmit lane may transmit data using a serial communication method, and a full-duplex communication may be performed between the UFS host 2100 and the UFS device 2200 by a structure in which the receive and transmit lanes are separated. That is, the UFS device 2200 may transmit data to the UFS host 2100 through the transmit lane even while receiving data from the UFS host 2100 through the receive lane. In addition, control data such as a command from the UFS host 2100 to the UFS device 2200 and user data for the UFS host 2100 to store in the nonvolatile storage 2220 of the UFS device 2200 or to read from the nonvolatile storage 2220 may be transmitted through the same lane. Accordingly, there is no need to further provide a separate lane for data transmission between the UFS host 2100 and the UFS device 2200 in addition to a pair of receive lanes and a pair of transmit lanes.

The UFS device controller 2210 of the UFS device 2200 may generally control the operation of the UFS device 2200. The UFS device controller 2210 may manage the nonvolatile storage 2220 through a logical unit (LU) 2211 that is a logical data storage unit. The number of LUs 2211 may be eight, but is not limited thereto. The UFS device controller 2210 may include a flash translation layer (FTL), and may convert a logical data address, for example, logical block address (LBA), transmitted from the UFS host 2100 into a physical data address, for example, a physical block address (PBA), using address mapping information of the FTL. In the UFS system 2000, a logical block storing user data may have a size of a predetermined range. For example, the minimum size of the logical block may be set to 4 Kbyte.

When a command from the UFS host 2100 is input to the UFS device 2200 through the UIC layer 2250, the UFS device controller 2210 may perform an operation according to the input command, and when the operation is completed, transmit a completion response to the UFS host 2100.

As an example, when the UFS host 2100 is to store user data in the UFS device 2200, the UFS host 2100 may transmit a data storage command to the UFS device 2200. When receiving a response indicating that the user data is ready-to-transfer from the UFS device 2200, the UFS host 2100 may transmit the user data to the UFS device 2200. The UFS device controller 2210 may temporarily store the received user data in the device memory 2240, and store the user data temporarily stored in the device memory 2240 in a selected location of the nonvolatile storage 2220 based on the address mapping information of the FTL.

As another example, when the UFS host 2100 is to read user data stored in the UFS device 2200, the UFS host 2100 may transmit a data read command to the UFS device 2200. The UFS device controller 2210 that received the command may read the user data from the nonvolatile storage 2220 based on the data read command and temporarily store the read user data in the device memory 2240. In this reading process, the UFS device controller 2210 may detect and correct an error in the read user data by using an embedded error correction code (ECC) circuit (not shown). In addition, the UFS device controller 2210 may transmit the user data temporarily stored in the device memory 2240 to the UFS host 2100. In addition, the UFS device controller 2210 may further include an advanced encryption standard (AES) circuit (not shown), and the AES circuit may encrypt or decrypt data input to the UFS device controller 2210 using a symmetric-key algorithm.

The UFS host 2100 may sequentially store commands to be transmitted to the UFS device 2200 from the UFS host register 2111 that may function as the CQ, and transmit the commands to the UFS device 2200 in the above order. At this time, the UFS host 2100 may transmit a next command waiting in the CQ to the UFS device 2200 even if a previously transmitted command is still being processed by the UFS device 2200, that is, even before receiving a notification that the previously transmitted command is completely processed by the UFS device 2200, and accordingly, the UFS device 2200 may also receive the next command from the UFS host 2100 while processing the previously transmitted command. A queue depth of commands that may be stored in such a CQ may be, for example, 32. In addition, the CQ may be implemented in a circular queue type that indicates the start and end of a sequence of commands stored in the queue through a head pointer and a tail pointer.

Each of the plurality of storage units 2221 may include a memory cell array and a control circuit that controls the operation of the memory cell array. The memory cell array of each of the storage units 2221 may include a 2D memory cell array or a 3D memory cell array. The memory cell array of each of the storage units 2221 includes a plurality of memory cells, and each memory cell may be a single level cell (SLC) that stores 1 bit of information, but may be a cell that stores 2 or more bits of information, such as a multi level cell (MLC), a triple level cell (TLC), and a quadruple level cell (QLC). The 3D memory cell array may include a vertically oriented vertical NAND string such that at least one memory cell is positioned above another memory cell.

VCC, VCCQ1, VCCQ2, etc. may be input to the UFS device 2200 as power supply voltages. VCC is the main power voltage for the UFS device 2200 and may have a value of 2.4V to 3.6V. VCCQ1 is the power voltage supplying a low range voltage, mainly for the UFS device controller 2210, and may have a value of 1.14V to 1.26V. VCCQ2 is the power voltage supplying a voltage in a range lower than VCC but higher than VCCQ1, is mainly for an input/output interface such as the MIPI M-PHY 2251, and may have a value of 1.7V to 1.95V. The power voltages may be supplied to each component of the UFS device 2200 through the regulator 2260. The regulator 2260 may be implemented in a set of unit regulators respectively connected to different ones among the above-described power voltages.

Figure 15:
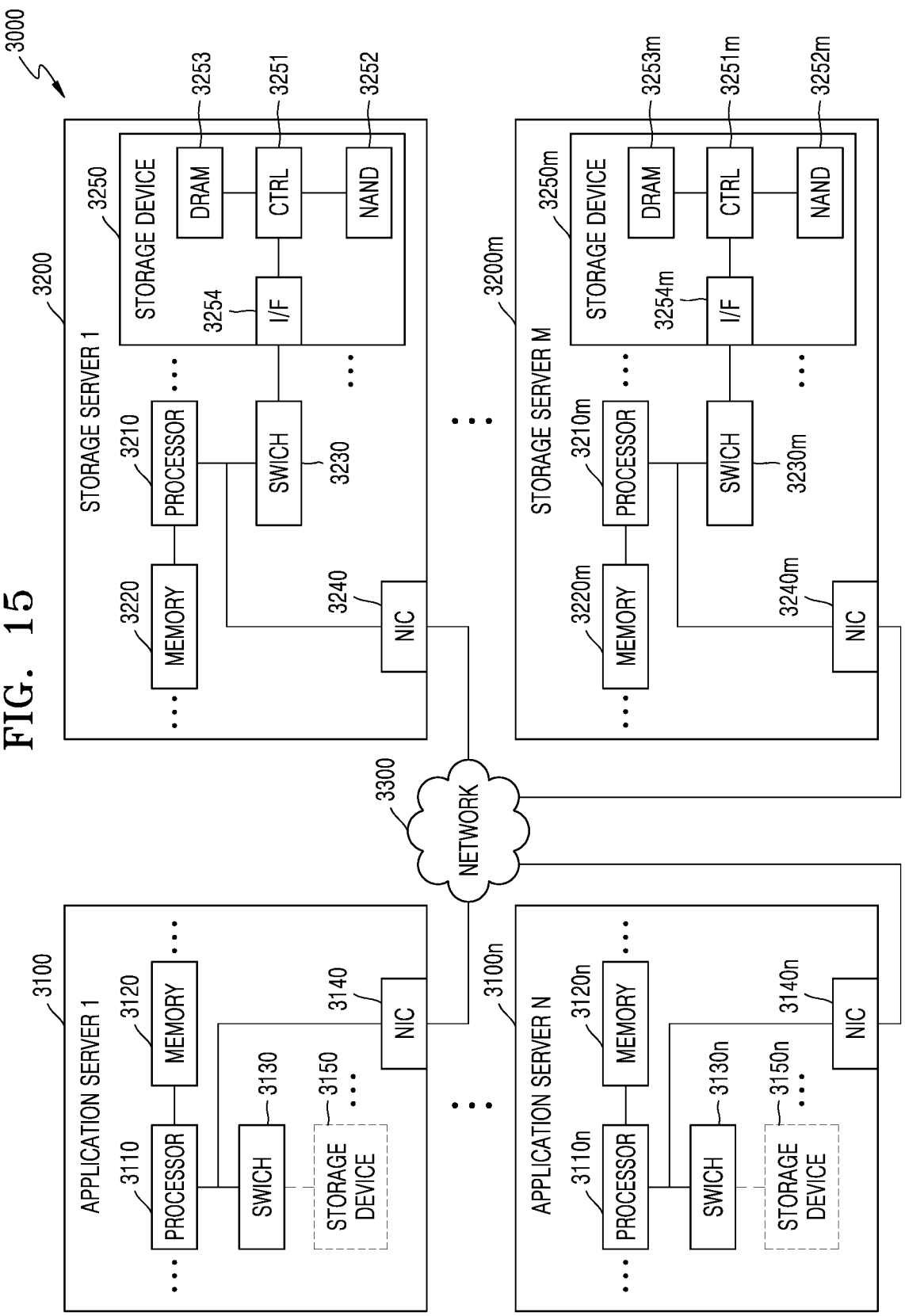
FIG. 15 is a diagram illustrating a data center to which a memory device is applied according to an embodiment of the inventive concept.

FIG. 15 is a diagram illustrating a data center 3000 to which a memory device is applied according to an embodiment of the inventive concept.

Referring to FIG. 15, the data center 3000 is a facility that collects various types of data and provides services, and may be referred to as a data storage center. The data center 3000 may be a system for operating a search engine and a database, and may be a computing system used by a company such as a bank or a government institution. The data center 3000 may include application servers 3100 to 3100n and storage servers 3200 to 3200m. The number of application servers 3100 to 3100n and the number of storage servers 3200 to 3200m may be variously selected according to example embodiments, and the number of application servers 3100 to 3100n and the number of the storage servers 3200 to 3200m may be different.

The application server 3100 or the storage server 3200 may include at least one of processors 3110 and 3210 and memories 3120 and 3220. When describing the storage server 3200 as an example, the processor 3210 may control the overall operation of the storage server 3200, and access the memory 3220 to store instructions and/or data loaded into the memory 3220. The memory 3220 may be a DDR SDRAM (Double Data Rate Synchronous DRAM), HBM (High Bandwidth Memory), HMC (Hybrid Memory Cube), DIMM (Dual In-line Memory Module), Optane DIMM or NVMDIMM (Non-Volatile DIMM). Depending on an embodiment, the number of processors 3210 and the number of memories 3220 included in the storage server 3200 may be variously selected. In an embodiment, the processor 3210 and the memory 3220 may provide a processor-memory pair. In an embodiment, the number of the processor 3210 and the memory 3220 may be different from each other. The processor 3210 may include a single-core processor or a multi-core processor. The description of the storage server 3200 may be similarly applied to the application server 3100. Depending on an embodiment, the application server 3100 may not include the storage device 3150. The storage server 3200 may include at least one storage device 3250. The number of storage devices 3250 included in the storage server 3200 may be variously selected depending on an embodiment. In example embodiments, the storage device 3250 may correspond to the MCP 10 of FIGS. 1 and 2.

The application servers 3100 to 3100n and the storage servers 3200 to 3200m may communicate with each other over a network 3300. The network 3300 may be implemented using Fiber Channel (FC) or Ethernet. In this regard, FC is a medium used for relatively highspeed data transmission, and may use an optical switch providing high performance/high availability. Depending on the access method of the network 3300, the storage servers 3200 to 3200m may be provided as file storage, block storage, or object storage.

In an embodiment, the network 3300 may be a storage-only network such as a storage area network (SAN). For example, the SAN may be an FC-SAN that uses an FC network and is implemented according to the FC Protocol (FCP). For another example, the SAN may be an IP-SAN that uses a TCP/IP network and is implemented according to an iSCSI (SCSI over TCP/IP or Internet SCSI) protocol. In another embodiment, the network 3300 may be a general network such as a TCP/IP network. For example, the network 3300 may be implemented according to protocols such as FCoE (FC over Ethernet), NAS (Network Attached Storage), and NVMe-oF (NVMe over Fabrics).

Hereinafter, the application server 3100 and the storage server 3200 will be mainly described. The description of the application server 3100 may be applied to the other application server 3100n, and the description of the storage server 3200 may be applied to the other storage server 3200m.

The application server 3100 may store data requested to be stored by a user or a client in one of the storage servers 3200 to 3200m over the network 3300. In addition, the application server 3100 may obtain data requested to be read by the user or the client from one of the storage servers 3200 to 3200m over the network 3300. For example, the application server 3100 may be implemented in a web server or a database management system (DBMS).

The application server 3100 may access the memory 3120n or the storage device 3150n included in the other application server 3100n over the network 3300, or access the memories 3220 to 3220m or the storage devices 3250 to 3250m included in the storage servers 3200 to 3200m over the network 3300. Accordingly, the application server 3100 may perform various operations on data stored in the application servers 3100 to 3100n and/or the storage servers 3200 to 3200m. For example, the application server 3100 may execute an instruction for moving or copying data between the application servers 3100 to 3100n and/or the storage servers 3200 to 3200m. At this time, data may be transferred from the storage devices 3250 to 3250m of the storage servers 3200 to 3200m to the memories 3120 to 3120n of the application servers 3100-3100n through the memories 3220 to 3220m of the storage servers 3200 to 3200m, or directly. Data moving through the network 3300 may be encrypted data for security or privacy.

Referring to the storage server 3200 as an example, the interface 3254 may provide a physical connection between the processor 3210 and the controller 3251 and a physical connection between the NIC 3240 and the controller 3251. For example, the interface 3254 may be implemented using a DAS (Direct Attached Storage) method of directly connecting the storage device 3250 with a dedicated cable. In addition, for example, the interface 3254 may be implemented in various interface methods such as an advanced technology attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), and a compact flash (CF) card interface.

The storage server 3200 may further include a switch 3230 and a NIC 3240. The switch 3230 may selectively connect the processor 3210 and the storage device 3250 or may selectively connect the NIC 3240 and the storage device 3250 under the control of the processor 3210.

In an embodiment, the NIC 3240 may include a network interface card, a network adapter, etc. The NIC 3240 may be connected to the network 3300 through a wired interface, a wireless interface, a Bluetooth interface, an optical interface, etc. The NIC 3240 may include an internal memory, a DSP, a host bus interface, etc., and may be connected to the processor 3210 and/or the switch 3230 through a host bus interface. The host bus interface may be implemented in one of the examples of the interface 3254 described above. In an embodiment, the NIC 3240 may be integrated with at least one of the processor 3210, the switch 3230, and the storage device 3250.

In the application servers 3100 to 3100n or the storage servers 3200 to 3200m, the processor 3210 may transmit a command to the storage devices 3150 to 3150n and 3250 to 3250m or the memories 3120 to 3120n and 3220 to 3220m to program or read data. In this regard, the data may be error-corrected data through an ECC engine. The data is data on which Data Bus Inversion (DBI) or Data Masking (DM) is processed, and may include Cyclic Redundancy Code (CRC) information. The data may be encrypted data for security or privacy.

The storage devices 3150 to 3150n and 3250 to 3250m may transmit a control signal and a command/address signal to the NAND flash memory devices 3252 to 3252m in response to a read command received from the processor 3210. Accordingly, when data is read from the NAND flash memory devices 3252 to 3252m, a read enable (RE) signal may be input as a data output control signal and may serve to output data to a DQ bus. A data strobe (DQS) may be generated by using the RE signal. The command and address signals may be latched in a page buffer according to a rising edge or a falling edge of a write enable (WE) signal.

The controller 3251 may overall control the operation of the storage device 3250. In an embodiment, the controller 3251 may include static random access memory (SRAM). The controller 3251 may write data to the NAND flash 3252 in response to a write command, or read data from the NAND flash 3252 in response to a read command. For example, the write command and/or the read command may be provided from the processor 3210 in the storage server 3200, the processor 3210m in the other storage server 3200m, or the processors 3110 and 3110n in the application servers 3100 and 3100n. The DRAM 3253 may temporarily store (buffer) data to be written to the NAND flash 3252 or data read from the NAND flash 3252. Also, the DRAM 3253 may store meta data. Here, the metadata is user data or data generated by the controller 3251 to manage the NAND flash 3252. The storage device 3250 may include a secure element (SE) for security or privacy.

The embodiments of the inventive concept provide a test method capable of determining whether a crack defect occurs in an NVM chip while testing a DRAM chip in order to avoid degradation in the test efficiency when a storage device including a plurality of types of semiconductor chips (e.g., the DRAM chip, the NVM chip, and a memory controller chip) is implemented in an MCP. Determining whether the crack defect occurs in the NVM chip includes applying a ground voltage to a channel terminal of test equipment connected to a hardware reset signal of the memory controller chip among package terminals of the MCP, making the NVM chip in the MCP enter in a low power mode, and determining whether the crack defect occurs when current measured in the test equipment exceeds a test reference value.

While the inventive concept has been particularly shown and described with reference to embodiments thereof, it will be understood that various changes in form and details may be made therein without departing from the spirit and scope of the following claims.

What is claimed is:

1. A method of manufacturing a multi-chip package (MCP) comprising a first type semiconductor chip and a second type semiconductor chip, the method comprising:
mounting the first type semiconductor chip on a substrate;
mounting the second type semiconductor chip on the first type semiconductor chip;
mounting a third type semiconductor chip on the substrate;
forming a mold layer to cover the first and second type semiconductor chips;
placing the MCP on test equipment, wherein the test equipment comprises a test host configured to test the MCP;
performing a function test on the first type semiconductor chip using first channel terminals of the test equipment, wherein the test host applies signals related to the function test of the first type semiconductor chip to the first channel terminals;
performing a low power mode test on the second type semiconductor chip using second channel terminals of the test equipment, wherein the test host applies signals related to the low power mode test of the second type semiconductor chip to the second channel terminals;
measuring current flowing through the second channel terminals in the low power mode test of the second type semiconductor chip;
analyzing a current measured in the second channel terminals to determine if a crack defect exists in the second type semiconductor chip; and
to make the second type semiconductor chip entering the low power mode test:
applying by the test host, a hardware reset signal RST_n having a ground voltage to a channel terminal connected to the third type semiconductor chip among the second channel terminals, and
transmitting a chip enable signal nCE having a high level to the second type semiconductor chip from the third type semiconductor chip,
wherein the function test of the first type semiconductor chip and the low power mode test of the second type semiconductor chip are performed in parallel, and
wherein in the low power mode test of the second type semiconductor chip, the second type semiconductor chip has a limited current load that flows a limited current through the second type semiconductor chip.

2. The method of claim 1, further comprising:
in the low power mode test of the second type semiconductor chip, determining, by the test host, the crack defect of the second type semiconductor chip when the current measured in the second channel terminals is greater than or equal to a test reference value.

3. The method of claim 1, wherein the mounting of the third type semiconductor chip includes electrically connecting the third type semiconductor chip to the second type semiconductor chip.

4. The method of claim 3, further comprising:
applying, by the test host, a corresponding power voltage to channel terminals connected to power voltages of the second and third type semiconductor chips among the second channel terminals; and
applying, by the test host, the ground voltage to the remaining channel terminals of the second channel terminals.

5. The method of claim 3, wherein:
the first type semiconductor chip comprises at least one volatile memory chip,
the second type semiconductor chip comprises nonvolatile memory chips stacked on each other, and
the third type semiconductor chip comprises a memory controller configured to control the nonvolatile memory chips.

6. The method of claim 3, further comprising:
forming the mold layer to cover the third type semiconductor chip.

7. A method of manufacturing a multi-chip package (MCP) implementing a storage device comprising a first type memory device, a second type memory device, and a memory controller configured to control the second type memory device, the method comprising:
mounting the first type memory device and the memory controller on a substrate;
mounting the second type memory device on the first type memory device;
forming a mold layer to cover the first and second type memory devices and the memory controller;
placing the MCP on test equipment, the test equipment comprising a test host configured to test the MCP;
performing a first function test on the first type memory device using first channel terminals of the test equipment, and simultaneously performing a low power mode test on the second type memory device using second channel terminals of the test equipment;
measuring current flowing through the second channel terminals in the low power mode test of the second type memory device;
analyzing a current measured in the second channel terminals to determine if a crack defect exists in the second type memory device;
performing a second function test on the memory controller and the second type memory device using the second channel terminals of the test equipment, and simultaneously performing a leakage current test on the first type memory device using the first channel terminals of the test equipment; and
to make the second type memory device entering the low power mode test:
applying, by the test host, a hardware reset signal RST_n having a ground voltage to a third channel terminal connected to the memory controller among the second channel terminals, and
transmitting a chip enable signal nCE having a high level to the second type memory device from the memory controller,
wherein in the low power mode test of the second type memory device the second type memory device has a limited current load that flows a limited current through the second type memory device.

8. The method of claim 7, wherein in the low power mode test of the second type memory device, the second type memory device has a limited current load that prevents a current from flowing through the second type memory device.

9. The method of claim 7, further comprising:
in the low power mode test of the second type memory device, determining, by the test host, the crack defect of the second type memory device when the current measured in the second channel terminals is greater than or equal to a test reference value.

10. The method of claim 7, further comprising:
applying, by the test host, a corresponding power voltage to channel terminals connected to power voltages of the second type memory device and the memory controller among the second channel terminals;
applying, by the test host, the ground voltage to the remaining channel terminals of the second channel terminals; and
determining, by the test host, a pass or failure of the low power mode test.

11. The method of claim 7, further comprising:
in the first function test of the first type memory device, applying, by the test host, signals related to the first function test of the first type memory device to the first channel terminals;
performing, by the test host, a low frequency function test and a high frequency function test of the first type memory device; and
determining, by the test host, a pass or failure of the first function test.

12. The method of claim 7, further comprising:
in the second function test of the memory controller and the second type memory device, applying, by the test host, signals related to the second function test of the memory controller and the second type memory device to the second channel terminals; and
determining, by the test host, a pass or failure of the second function test.

13. The method of claim 7, further comprising:
in the leakage current test of the first type memory device, applying, by the test host, a corresponding power voltage to channel terminals connected to power voltages of the first type memory device among the first channel terminals;
applying, by the test host, the ground voltage to the remaining channel terminals of the first channel terminals; and
determining, by the test host, a pass or failure of the leakage current test.

14. The method of claim 7, wherein the first type memory device comprises at least one volatile memory chip, and
wherein the second type memory device comprises nonvolatile memory chips stacked on each other.

15. The method of claim 14, wherein the at least one volatile memory chip comprises a low power double data rate (LPDDR) DRAM, and the nonvolatile memory chips comprise NAND flash memories.

* * * * *